(12) United States Patent
Hatasaki et al.

(10) Patent No.: US 7,870,405 B2
(45) Date of Patent: Jan. 11, 2011

(54) METHOD OF CONTROLLING POWER CONSUMPTION OF A MEMORY ACCORDING TO MAPPING

(75) Inventors: Keisuke Hatasaki, Kawasaki (JP); Yoshifumi Takamoto, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 500 days.

(21) Appl. No.: 12/041,311

(22) Filed: Mar. 3, 2008

(65) Prior Publication Data
US 2009/0125667 A1 May 14, 2009

(30) Foreign Application Priority Data
Nov. 12, 2007 (JP) ............................. 2007-292959

(51) Int. Cl.
G06F 1/00 (2006.01)
G06F 1/26 (2006.01)
G06F 1/32 (2006.01)
G06F 9/455 (2006.01)

(52) U.S. Cl. ............................ 713/320; 713/300; 718/1

(58) Field of Classification Search .................. 713/300, 713/320; 718/1
See application file for complete search history.

(56) References Cited

U.S. PATENT DOCUMENTS

| | | | |
|---|---|---|---|
| 6,751,739 B1 * | 6/2004 | Verdun | 713/300 |
| 7,640,543 B2 * | 12/2009 | Vij et al. | 718/1 |
| 2005/0235123 A1 * | 10/2005 | Zimmer et al. | 711/170 |
| 2007/0234077 A1 * | 10/2007 | Rothman et al. | 713/300 |
| 2009/0089531 A1 * | 4/2009 | Johnson et al. | 711/170 |
| 2010/0037038 A1 * | 2/2010 | Bieswanger et al. | 712/220 |

FOREIGN PATENT DOCUMENTS

JP 2007-310791 11/2007

\* cited by examiner

*Primary Examiner*—Mark Connolly
(74) *Attorney, Agent, or Firm*—Brundidge & Stanger, P.C.

(57) ABSTRACT

There is provided a method of controlling power consumption of a memory, which is executed in a computer system including operation server and a management server. The operation server includes one or more memory chips which are units to control the power consumption of the memory, a power control module for controlling power consumption of the memory chips, and a virtualization module for operating one or more virtual servers. The management server manages the mapping between the one or more virtual servers and the one or more memory chips. The method comprises the steps of instructing the operation server to change the power consumption of the one or more memory chips based on whether the obtained access information is capable of achieving predetermined target performance and the mapping information, and changing the power consumption of the one or more memory chips based on the instruction from the management server.

15 Claims, 34 Drawing Sheets

MEMORY MAPPING TABLE

| MEMORY CHIP (501) | MEMORY CHIP ADDRESS (502) | ALLOCATION DESTINATION (503) | VIRTUAL SERVER ADDRESS (504) |
|---|---|---|---|
| 1 | 0h - 7FFFFFFFh | VIRTUAL SERVER 1 | 0h - 7FFFFFFFh |
| | 80000000h - BFFFFFFFh | VIRTUAL SERVER 2 | 0h - 3FFFFFFFh |
| | C0000000h - 7FFFFFFFh | UNALLOCATED | - |
| 2 | 100000000h - 1FFFFFFFFh | VIRTUAL SERVER 3 | 0h - FFFFFFFFh |
| 3 | 200000000h - 2BFFFFFFFh | | 100000000h - 1BFFFFFFFh |
| | 2C0000000h - 2FFFFFFFFh | UNALLOCATED | - |
| 4 | 300000000h - 33FFFFFFFh | UNALLOCATED | - |
| | 340000000h - 3FFFFFFFFh | VIRTUAL SERVER 4 | 0h - BFFFFFFFh |
| 5 | 400000000h - 41FFFFFFFh | VIRTUALIZATION MODULE | |
| | 420000000h - 4FFFFFFFFh | UNALLOCATED | |
| 6 | 500000000h - 5FFFFFFFFh | UNALLOCATED | - |

*FIG. 5*

| 701 | 702 | 703 | 704 |
|---|---|---|---|
| VIRTUAL SERVER | STATUS | USED MEMORY CAPACITY | MEMORY ACCESS INFORMATION |
| 1 | OPERATING | 2GB | HIGH |
| 2 | OPERATING | 1GB | LOW |
| 3 | OPERATING | 7GB | HIGH |
| 4 | OPERATING | 3GB | LOW |
| 5 | STOPPED | 0B | - |

VIRTUAL SERVER MANAGEMENT TABLE

*FIG. 7*

| 801 | 802 | 803 | 804 |
|---|---|---|---|
| MEMORY CHIP | CAPACITY | ALLOCATION DESTINATION | STATUS |
| 1 | 4GB | 1, 2 | NORMAL |
| 2 | 4GB | 3 | NORMAL |
| 3 | 4GB | 3 | NORMAL |
| 4 | 4GB | 4 | NORMAL |
| 5 | 4GB | VIRTUALIZATION MODULE | NORMAL |
| 6 | 4GB | UNALLOCATED | POWER SAVING |

MEMORY MANAGEMENT TABLE

*FIG. 8*

| VIRTUAL SERVER (901) | MEMORY CAPACITY (902) | DEFAULT STATUS (903) |
|---|---|---|
| 1 | 2GB | HIGH |
| 2 | 1GB | HIGH |
| 3 | 7GB | LOW |
| 4 | 3GB | LOW |
| 5 | 2GB | LOW |

VIRTUAL SERVER SETTING TABLE

*FIG. 9*

1001 VIRTUAL SERVER MEMORY SETTING

- 1010: VIRTUAL SERVER 1 ▼
- 1010: MEMORY CAPACITY — 2GB
- 1011: DEFAULT STATUS — HIGH ▼
- 1020: SET
- 1021: CANCEL

*FIG. 10*

| 1601 | 1602 | 1603 | 1604 | 1605 |
|---|---|---|---|---|
| MEMORY CHIP | MEMORY CHIP ADDRESS | ALLOCATION DESTINATION | VIRTUAL SERVER ADDRESS | UPDATED ADDRESS |
| 1 | 80000000h - BFFFFFFFh | MIGRATION SOURCE VIRTUAL SERVER 2 | 0h - 3FFFFFFFh | 0 - 1FFFFFFFh, 2FFFFFFF - 3FFFFFFFh |
| 4 | 300000000h - 33FFFFFFFh | MIGRATION DESTINATION VIRTUAL SERVER 2 | 0h - 3FFFFFFFh | - |

TEMPORARY MEMORY MAPPING TABLE

FIG. 12

| VIRTUAL SERVER | STATUS | USED MEMORY CAPACITY | MEMORY ACCESS INFORMATION | CPU USE RATE |
|---|---|---|---|---|
| 1 | OPERATING | 2GB | HIGH | 30% |
| 2 | OPERATING | 1GB | LOW | 20% |
| 3 | OPERATING | 7GB | HIGH | 40% |
| 4 | OPERATING | 3GB | LOW | 30% |
| 5 | STOPPED | 0B | - | - |

VIRTUAL SERVER MANAGEMENT TABLE

| 801 | 802 | 803 | 804 | 805 |
|---|---|---|---|---|
| MEMORY CHIP | CAPACITY | ALLOCATION DESTINATION | STATUS | NORMAL OPERATION TIME |
| 1 | 4GB | 1, 2 | NORMAL | 300 HOUR |
| 2 | 4GB | 3 | NORMAL | 300 HOUR |
| 3 | 4GB | 3 | NORMAL | 250 HOUR |
| 4 | 4GB | 4 | NORMAL | 300 HOUR |
| 5 | 4GB | VIRTUALIZATION MODULE | NORMAL | 200 HOUR |
| 6 | 4GB | UNALLOCATED | POWER SAVING | 75 HOUR |

MEMORY MANAGEMENT TABLE

FIG. 32

| MEMORY CHIP 501 | MEMORY CHIP ADDRESS 502 | ALLOCATION DESTINATION 503 | PROCESS 505 | VIRTUAL SERVER ADDRESS 504 |
|---|---|---|---|---|
| 1 | 0h - 7FFFFFFFh | VIRTUAL SERVER 1 | OS | 0h - 1FFFFFFFh |
| | 20000000h - 3FFFFFFFh | | PROCESS 1 | 20000000h - 3FFFFFFFh |
| | 40000000h - 7FFFFFFFh | | PROCESS 2 | 40000000h - 7FFFFFFFh |
| | 80000000h - 9FFFFFFFh | VIRTUAL SERVER 2 | OS | 0h - 1FFFFFFFh |
| | A0000000h - AFFFFFFFh | | PROCESS 1 | 0h - FFFFFFFh |
| | B0000000h - BFFFFFFFh | | PROCESS 2 | 0h - FFFFFFFh |
| | C0000000h - FFFFFFFFh | UNALLOCATED | UNALLOCATED | - |

MEMORY MAPPING TABLE

*FIG. 33*

MEMORY MAPPING TABLE

| MEMORY CHIP 801 | CAPACITY 802 | ALLOCATION DESTINATION 803 | STATUS 804 |
|---|---|---|---|
| 1 | 4GB | 1 (REDUNDANT), 2 | NORMAL |
| 2 | 4GB | 3 | NORMAL |
| 3 | 4GB | 3, 1 (BUFFER) | NORMAL |
| 4 | 4GB | 4 | NORMAL |
| 5 | 4GB | VIRTUALIZATION MODULE | NORMAL |
| 6 | 4GB |  | POWER SAVING |

MEMORY MANAGEMENT TABLE

FIG. 36

METHOD OF CONTROLLING POWER CONSUMPTION OF A MEMORY ACCORDING TO MAPPING

CLAIM OF PRIORITY

The present application claims priority from Japanese patent application P 2007-292959 filed on Nov. 12, 2007, the content of which is hereby incorporated by reference into this application.

BACKGROUND OF THE INVENTION

This invention relates to a method of controlling power consumption of a memory, and more particularly, to a power saving method for the memory.

As regards a server-mounted memory, with reduction in cost and popularization of a 64-bit address capable processor, a memory with a large capacity has been mounted in a server. An in-memory database system that uses a memory with a large capacity, and a technology of duplicating a memory to improve reliability have come into wide use.

However, the popularization of such a technology has resulted in a greater amount of power consumed by the memory. Thus, a technology of reducing power consumption of the memory is needed.

To solve the problem, a method is available which suppresses power consumption of the memory by stopping power supply to unused memory chips.

Generally, however, in many cases, once an OS or an application program uses the memory, the memory is kept accessible until the OS or the application program shuts down. As a result, the method cannot be applied.

SUMMARY OF THE INVENTION

An object of this invention is to reduce power consumption by controlling power consumption of a memory mounted in a server.

A representative aspect of this invention is as follows. That is, there is provided a method of controlling power consumption of a memory, which is executed in a computer system including at least one operation server, a management server for managing the at least one operation server, and a network for coupling the at least one operation server and the management server. The at least one operation server has one or more memory chips which are units to control the power consumption of the memory, a power control module for controlling power consumption of the one or more memory chips between a power saving status and a normal status, and a virtualization module for operating one or more virtual servers. The virtualization module has a memory mapping module for managing mapping between the one or more virtual servers and the one or more memory chips. The management server manages the mapping information between the one or more virtual servers and the one or more memory chips. The method comprising: an information acquisition step of obtaining, by the management server, access information to the one or more memory chips of the one or more virtual servers; an instructing step of instructing, by the management server, the at least one operation server to change the power consumption of the one or more memory chips based on whether the obtained access information is capable of achieving predetermined target performance and the mapping information between the one or more virtual servers and the one or more memory chips; and a power control step of changing, by the at least one operation server, the power consumption of the one or more memory chips based on the instruction from the management server.

According to the exemplary embodiment of this invention, even when a memory used for an OS or an application is reserved, power consumption can be reduced by properly controlling power consumption of the memory according to the use status of the memory.

BRIEF DESCRIPTION OF THE DRAWINGS

The present invention can be appreciated by the description which follows in conjunction with the following figures, wherein:

FIG. 5 is an explanatory diagram showing a memory mapping table in accordance with the first embodiment of this invention;

FIG. 7 is an explanatory diagram showing a configuration of a virtual server management table in accordance with the first embodiment of this invention;

FIG. 8 is an explanatory diagram showing a configuration of a memory management table in accordance with the first embodiment of this invention;

FIG. 9 is an explanatory diagram showing a configuration of a virtual server setting table in accordance with the first embodiment of this invention;

FIG. 10 is an explanatory diagram showing an example of a graphical user interface (GUI) provided by the power management program in accordance with the first embodiment of this invention;

FIG. 12 is an explanatory diagram showing a configuration of a temporary mapping table in accordance with the first embodiment of this invention;

FIG. 32 is an explanatory diagram showing a configuration of a memory management table in accordance with a fifth embodiment of this invention;

FIG. 33 is an explanatory diagram showing a memory mapping table in accordance with a sixth embodiment of this invention;

FIG. 36 is an explanatory diagram showing a configuration of a memory management table in accordance with the seventh embodiment of this invention.

DETAILED DESCRIPTION OF THE PREFERRED EMBODIMENTS

Figure 1:
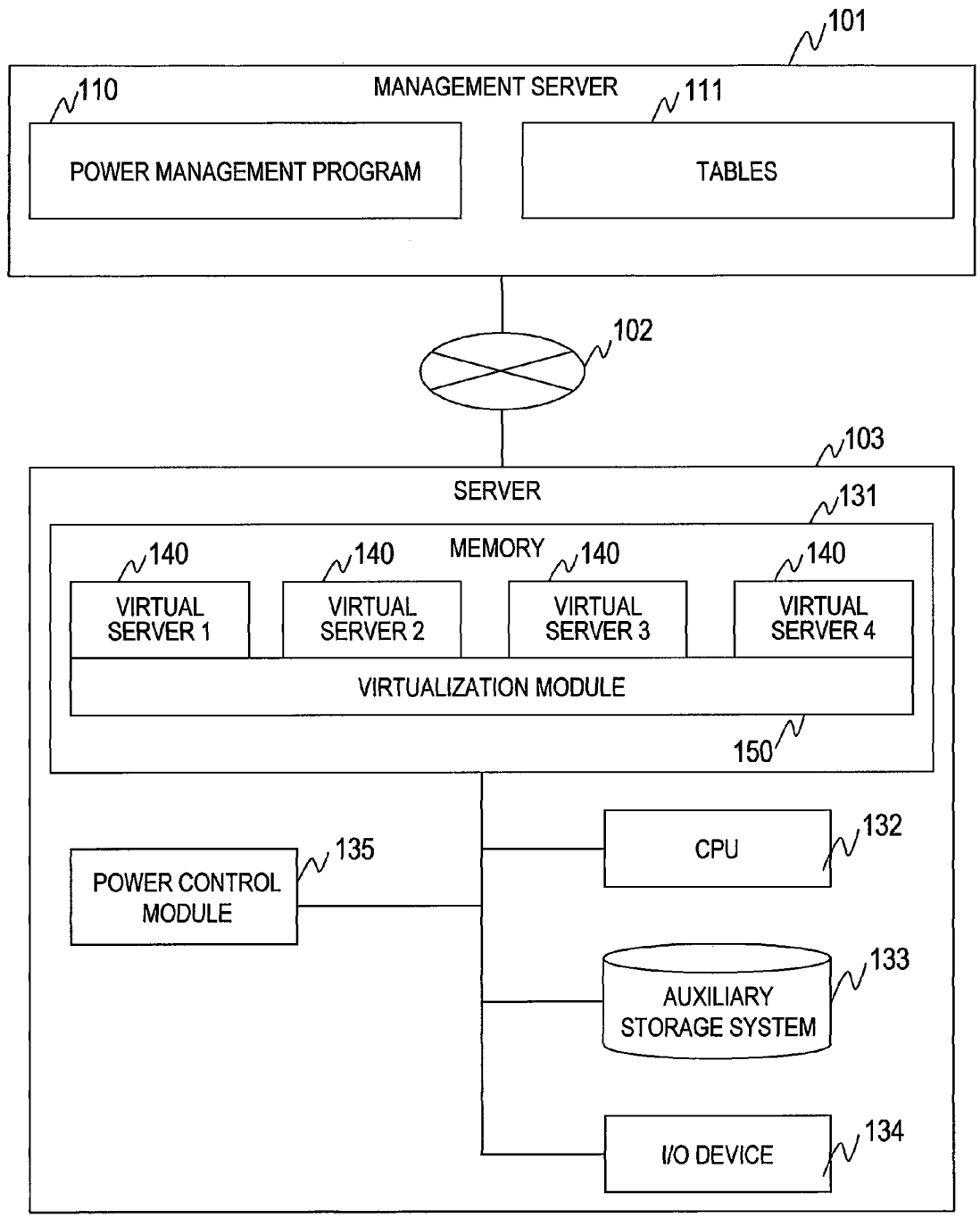
FIG. 1 is a block diagram showing a configuration of a computer system in accordance with a first embodiment of this invention.

Hereinafter, preferred embodiments of this invention will be described below referring to the drawings.

The embodiments described below are only exemplary, and a combination of the embodiments is also within this invention. The embodiments described below are in no way limitative of a scope of the invention.

First Embodiment

FIG. 1 illustrates a configuration of a computer system according to a first embodiment of this invention.

The computer system includes a management server 101 and a server 103. The management server 101 and the server 103 are intercoupled via a network 102.

The management server 101 includes a power control program 110 and tables 111.

The server 103 includes a memory 131, a CPU 132, an auxiliary storage system 133, an I/O device 134, and a power control module 135. An operation is carried out by executing an application program.

The memory 131 includes a virtualization module 150 and virtual servers 140. The virtualization module 150 and the virtual servers 140 include programs and data. The virtualization module 150 controls the virtual servers 140. The virtual servers 140 can divide or share the memory 131 of the server 103 to use the memory 131.

According to the first embodiment of this invention, the virtualization module 150 is mounted as a program. However, a part of, or the entire virtualization module 150 may be realized by mounting hardware such as a custom processor.

The CPU 132 is a processor for executing a program stored in the memory 131.

The auxiliary storage system 133 is a storage system such as hard disk or a flash memory.

The I/O device 134 is an input/output device (interface) such as a network interface card (NIC).

The power control module 135 controls a power consumption status of the memory 131. The power control module 135 may be mounted by hardware or realized by mounting software such as a program.

The power control module 135 receives a power control request from the management server 101 via the I/O device 134. For a method which enables the power control module 135 to control a power consumption status of the memory 131, for example, a method of controlling an operation frequency or a voltage of the memory 131, a method of controlling performance of the memory 131, or a method of stopping power supply to the memory 131 can be used.

Units of the memory 131 that the power control module 135 can control are, for example, one or more memory chips which constitute the memory 131. In other words, the memory chip is a unit by which the power control module 135 can control power consumption of the memory 131. Other control methods of a power consumption status and power control units are also within the invention.

In an example of FIG. 1, the computer system includes one server 103. However, the computer system may include a plurality of servers 103. The virtualization module 150 controls the four virtual servers 140. However, the virtualization module 150 can control any number of virtual servers.

Figure 2:
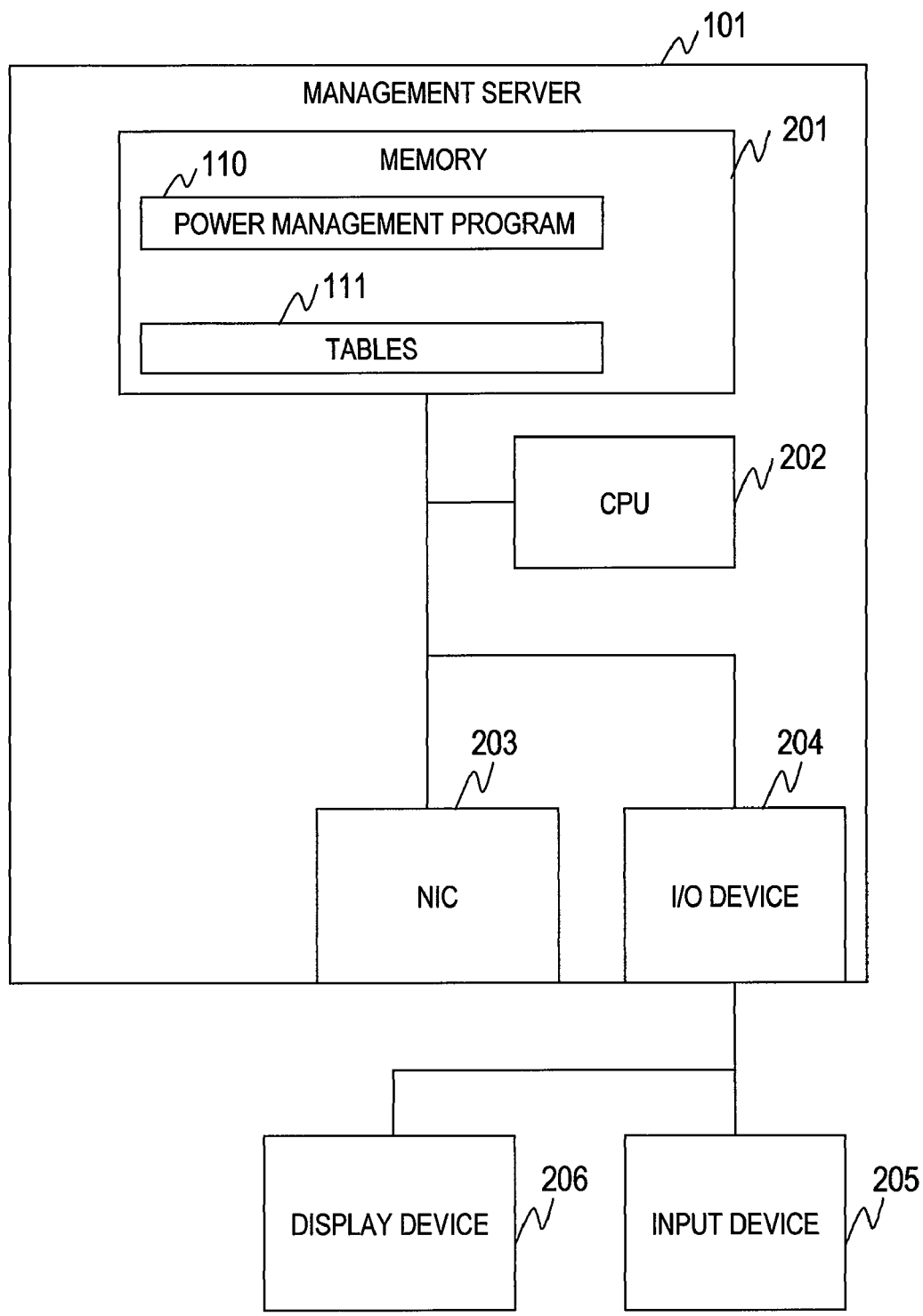
FIG. 2 is a block diagram showing a configuration of the management server in accordance with the first embodiment of this invention.

FIG. 2 illustrates a configuration of the management server 101 according to the first embodiment of this invention.

The management server 101 includes a memory 201, a CPU 202, a NIC 203, and an I/O device 204.

The memory 201 stores a power control program 110 and tables 111.

The CPU 202 is a processor for executing a program stored in the memory 201. In an example of FIG. 2, the management server 101 includes one CPU 202. However, the management server 101 may include a plurality of CPU's 202.

The NIC 203 is an interface for coupling to the network 102.

The I/O device 204 is an interface for inputting or outputting information to the management server 101. An input device 205 such as a mouse and/or a keyboard, and a display device 206 such as a display are coupled to the I/O device 204. An external storage system such as a USB medium may be coupled to the I/O device 204 to read/write information. The management server 101 may include an auxiliary storage system such as a hard disk or a flash memory.

Figure 3:
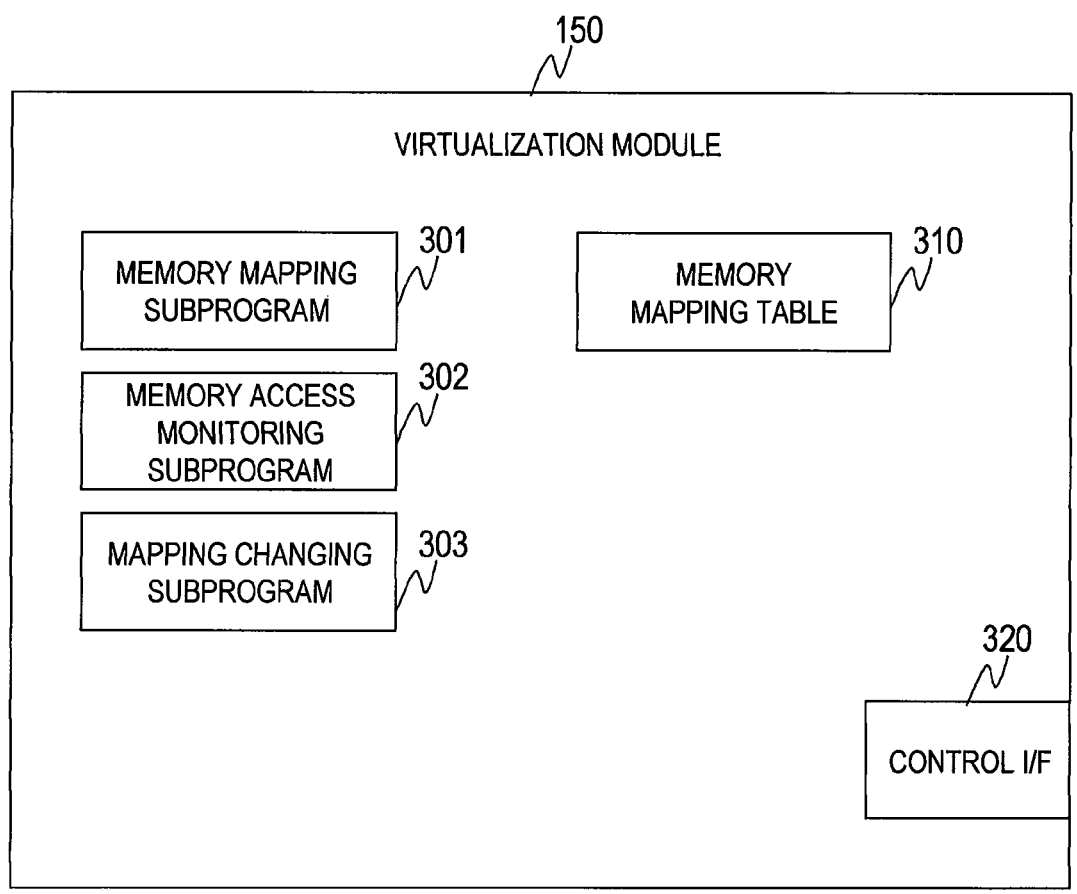
FIG. 3 is an explanatory diagram showing a configuration of the virtualization module in accordance with the first embodiment of this invention.

FIG. 3 illustrates a configuration of the virtualization module 150 according to the first embodiment of this invention.

The virtualization module 150 includes a memory mapping subprogram 301, a memory access monitoring subprogram 302, a mapping changing subprogram 303, a memory mapping table 310, and a control I/F 320.

The memory mapping subprogram 301 manages mapping (correspondence) between each virtual server 140 and the memory 131.

The memory access monitoring subprogram 302 monitors a memory access frequency (memory performance information) of each virtual server 140.

The mapping changing subprogram 303 changes the mapping between each virtual server 140 and the memory 131.

The memory mapping table 310 holds the mapping between each virtual server 140 and the memory 131. The memory mapping table 310 will be described later in detail referring to FIG. 5.

The control I/F 320 is an interface for communicating with an external device (e.g., management server 101).

The virtualization module 150 and parts or all components thereof may be mounted as hardware by a custom processor.

Figure 4:
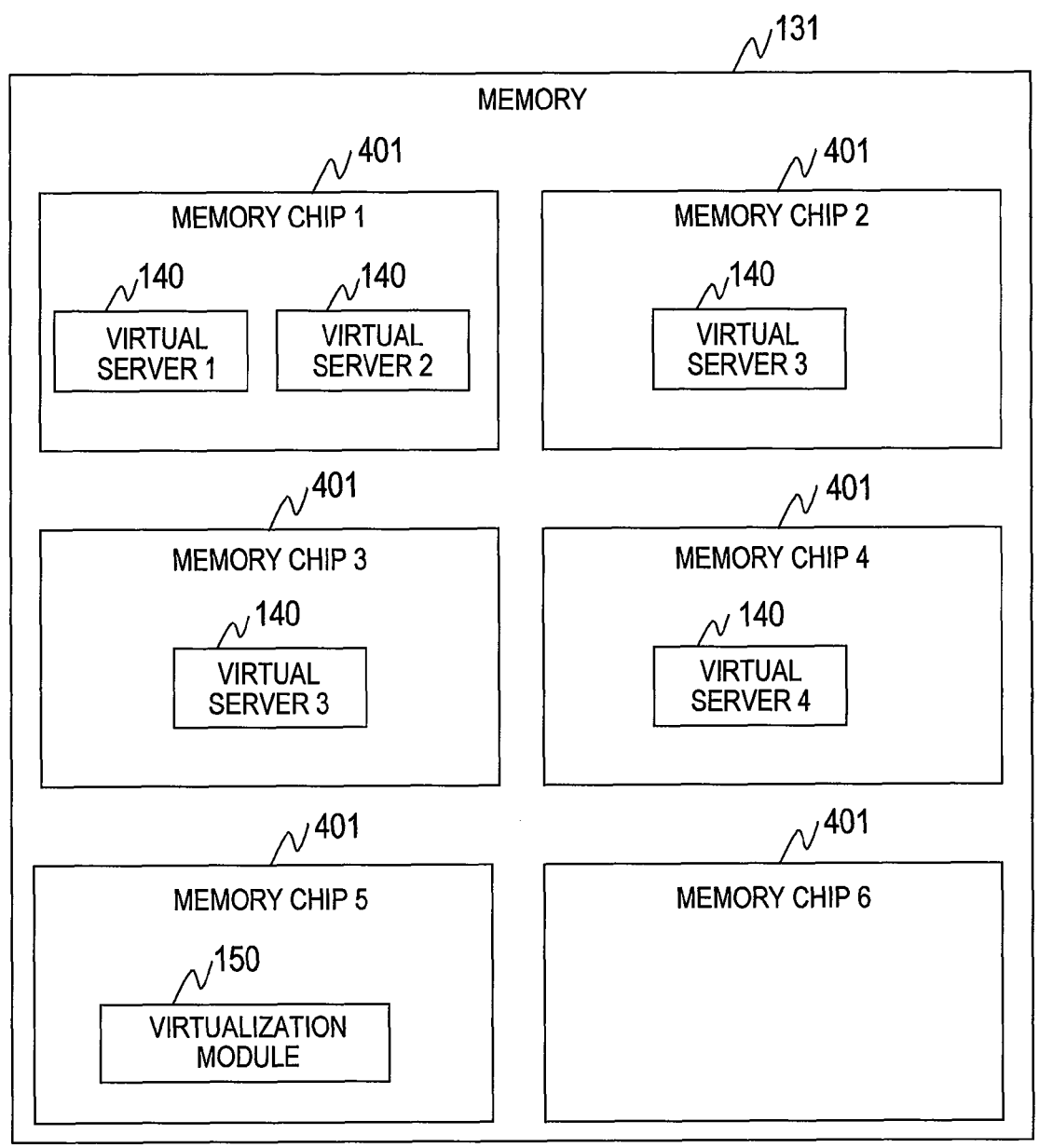
FIG. 4 is an explanatory diagram showing an example of mapping between the memory and the virtual server in accordance with the first embodiment of this invention.

FIG. 4 illustrates mapping between the memory 131 and the virtual server 140 according to the first embodiment of this invention.

The memory 131 includes memory chips 401 (memory chips 1 to 6).

Each memory chip 401 corresponds to a predetermined area of addresses of the memory 131. For example, among all addresses of the memory 131, addresses of a first 4 GB area corresponds to a part of or the entire memory chip 1, and addresses of the next 4 GB area corresponds to a part of or the entire memory chip 2.

In an example of FIG. 4, a program and data used by the virtual servers 1 and 2 are held in the area of the memory chip 1. A program and data used by the virtual server 3 are held in both of the areas of the memory chip 2 and a memory chip 3. A program and data used by the virtual server 4 are held in the area of the memory chip 4. A program and data used by the virtualization module 150 are held in the area of the memory chip 5.

In the example of FIG. 4, the memory 131 includes the six memory chips 401. However, the memory 131 may include a plurality of memory chips 401 other than six.

FIG. 5 illustrates a memory mapping table 310 according to the first embodiment of this invention.

The memory mapping table 310 includes a memory map 501, a memory chip address 502, an allocation destination 503, and a virtual server address 504.

The memory chip 501 is an identifier of the memory chip 401 shown in FIG. 4.

The memory chip address 502 is an area of addresses corresponding to the memory chip 401 indicated by the memory map 501. In an example of FIG. 5, an address stored in the memory chip address 502 is represented by a hexadecimal numeral. Continuous addresses are allocated in order from the memory chip 1. However, an optional address range may be allocated to each memory chip 401.

The allocation destination 503 is an identifier of an allocation destination of addresses indicated by the memory chip address 502. The identifier of the allocation destination is, for example, an identifier of the virtual server 140 or the virtualization module 150. "UNALLOCATED" is stored if no allocation destination is present.

The virtual server address 504 indicates addresses of an allocation destination indicated by the allocation destination 503 corresponding to the addresses indicated by the memory chip address 502. Specifically, the virtual server address 504 is addresses seen from an OS of the virtual server 140.

In an example of FIG. 5, "1", "80000000h-BFFFFFFFh", and "VIRTUAL SERVER 2", "0h-3FFFFFFFh" are respectively stored in the memory chip 501, the memory chip address 502, the allocation destination 503, and the virtual server address 504 of a second line of the memory mapping table 310. This indicates that an area of memory addresses "80000000h-BFFFFFFFh" of the memory chip "1" corresponds to an area of memory addresses "0h-3FFFFFFFh" of the "VIRTUAL SERVER 2".

Information of a part of the memory mapping table 310 is not always necessary. A format of the memory mapping table 310 is not limited to that shown in FIG. 5. Any format can be employed as long as it enables holding of similar information.

Figure 6:
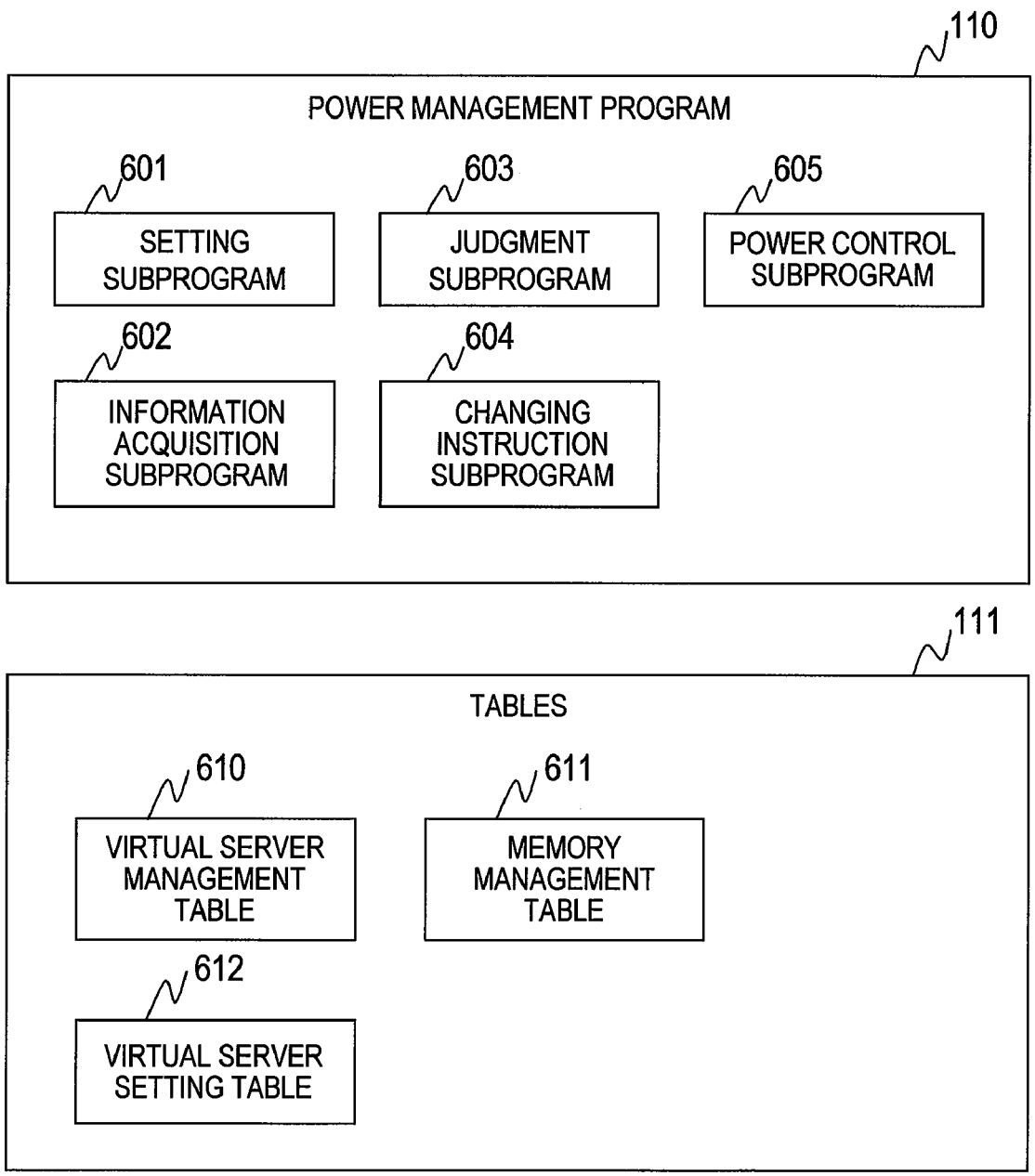
FIG. 6 is an explanatory diagram showing a configuration of a power management program and a configuration of tables in accordance with the first embodiment of this invention.

FIG. 6 illustrates configurations of the power management program 110 and the tables 111 according to the first embodiment of this invention.

The power management program 110 includes a setting subprogram 601, an information acquisition subprogram 602, a judgment subprogram 603, a changing instruction subprogram 604, and a power control subprogram 605.

The setting subprogram 601 sets the virtual server 140. The information acquisition subprogram 602 obtains information from the server 103. The judgment subprogram 603 judges changing of the memory mapping table 310. The changing instruction subprogram 604 instructs changing of the memory mapping table 310. The power control subprogram 605 controls power of the memory 131.

The power management program 110 and a part of or all components thereof may be mounted as hardware by a custom processor.

The tables 111 includes a virtual server management table 610, a memory management table 611, and a virtual server setting table 612.

The virtual server management table 610 holds a status of the virtual server 140. The virtual server management table 610 will be described later in detail referring to FIG. 7.

The memory management table 611 holds a status of the memory 131. The memory management table 611 will be described later in detail referring to FIG. 8.

The virtual server setting table 612 holds setting information of the virtual server 140.

FIG. 7 illustrates the virtual server management table 610 according to the first embodiment of this invention.

The virtual server management table 610 includes a virtual server 701, a status 702, a used memory capacity 703, and memory access information 704.

The virtual server 701 is an identifier of the virtual server 140.

The status 702 is a status of the virtual server 140 indicated by the virtual server 701. For example, a status is "OPERATING" if the virtual server 140 is being operated. A status is "STOPPED" if the virtual server 140 is stopped. The "OPERATING" indicates a case where a status of the virtual server 140 is held in the memory 131 as, for example, an operating or suspended status of the virtual server 140. The "STOPPED" indicates a case where a status of the virtual server 140 is not held in the memory as, for example, an nonoperating or standby status of the virtual server 140.

The used memory capacity 703 is a capacity of a memory used by the virtual server 140 indicated by the virtual server 701. For example, when the status 702 is "STOPPED", the used memory capacity 703 is "0B".

The memory access information 704 indicates information of memory access of the virtual server 140 indicated by the virtual server 701. The memory access information 704 has no value while the target virtual server 140 is stopped. Thus, the memory access information 704 is "–" in an example of FIG. 7. The memory access information 704 stores a value of "HIGH" or "LOW". For example, "HIGH" is a status of a high memory access frequency, and "LOW" is a status of a low memory access frequency.

When the status 702 is a suspended status, a status of "LOW" is set in the memory access information 704.

In the example of FIG. 7, "1", "OPERATING", "2 GB" and "HIGH" are respectively stored in the virtual server 701, the status 702, the used memory capacity 703, and the memory access information 704 of a first line of the virtual server management table 610. This indicates that the virtual server "1" is being operated, a memory of 2 GB is being used, and the memory chip 401 allocated to the virtual server "1" is in a normal status.

Information of a part of the virtual server management table 610 is not always necessary. A format of the virtual server management table 610 is not limited to that of FIG. 7. Any format can be used as long as it enables holding of similar information.

FIG. 8 illustrates the memory management table 611 according to the first embodiment of this invention.

The memory management table 611 includes a memory chip 801, a capacity 802, an allocation destination 803, and a status 804.

The memory chip 801 is an identifier of the memory chip 401.

The capacity 802 is a capacity of the memory chip 401 indicated by the memory chip 801.

The allocation destination 803 is an identifier of an allocation destination of the memory chip 401 indicated by the memory chip 801. For example, "1, 2" indicates that the virtual servers 1 and 2 are allocation destinations. "VIRTUALIZATION MODULE" indicates that an allocation destination is a virtualization module 150. "UNALLOCATED" indicates that no allocation destination is present.

The status 804 is a power consumption status of the memory chip 401 indicated by the memory chip 801. "NORMAL" is set if the memory chip 401 is operated in a normal status. "POWER SAVING" is set if the memory chip 401 is operated in a power saving status. The power saving status has a plurality of status levels, including a status where an operation frequency and a voltage of the memory 131 are reduced, a status where performance of the memory 131 is reduced, and a status where power supply to the memory 131 is stopped. The power saving status includes other status levels as well.

When the virtual server 140 reserved for the memory chip 401 is no longer necessary, the memory chip 401 may be stopped.

Information of a part of the memory management table 611 is not always necessary. A format of the memory management table 611 is not limited to that of FIG. 8. Any format can be employed as long as it enables holding of similar information.

FIG. 9 illustrates the virtual server setting table 612 according to the first embodiment of this invention.

The virtual server setting table 612 includes a virtual server 901, a memory capacity 902, and a default status 903.

The virtual server 901 is an identifier of the virtual server 140.

The memory capacity 902 is a maximum memory capacity used by the virtual server 140 indicated by the virtual server 901. The maximum memory capacity means a maximum memory capacity used by the virtual server 140 indicated by the virtual server 901.

The default status 903 is a default status (initially set status) of a memory chip used by the virtual server 140 indicated by the virtual server 901. In the case of "HIGH", a normal status is a default status for the memory chip 401 allocated to the virtual server 140. In the case of "LOW", a power saving status is a default status. A default status indicated by the default status 903 does not always need to have two values "HIGH" and "LOW". Alternatively, three or more values may be stored. Information indicated by a numerical value may be stored in the default status 903.

Information of a part of the virtual server setting table 612 is not always necessary. A format of the virtual server setting table 612 is not limited to that of FIG. 9. Any format can be employed as long as it enables holding of similar information.

FIG. 10 illustrates an example of a graphical user interface (GUI) provided by the power management program 110 to obtain user setting information in the process of the setting subprogram 601 according to the first embodiment of this invention.

The GUI of FIG. 10 displays memory setting information of the virtual server 140 in the display device 206 shown in FIG. 2 or the other display device coupled via a network by using one of a browser or a dedicated program.

A window 1001 indicates a window of the browser or the dedicated program. Memory setting information of the virtual server 140 is displayed in the window 1001.

A user selects an identifier of a virtual server 140 to be set in the memory 131 in a selection frame 1010 of the virtual server 140. A maximum memory capacity of the virtual server 140 selected in the selection frame 1010 by the user is inputted to a memory capacity frame 1010. In a default status frame 1011, a default status of the memory 131 allocated to the virtual server 140 selected in the selection frame 1010 by the user is selected.

Upon completion of the input, a setting button 1020 is operated by a mouse or the like to complete setting. The inputted pieces of information are respectively stored in the virtual server 901, the memory capacity 902, and the default status 903 shown in FIG. 9.

To cancel the setting, a cancel button 1021 is operated by the mouse or the like. The GUI does not always have to be capable of inputting some of the pieces of information. A format of the GUI is not limited to that shown in FIG. 10. Any format can be employed as long as it enables inputting of similar information.

Figure 11:
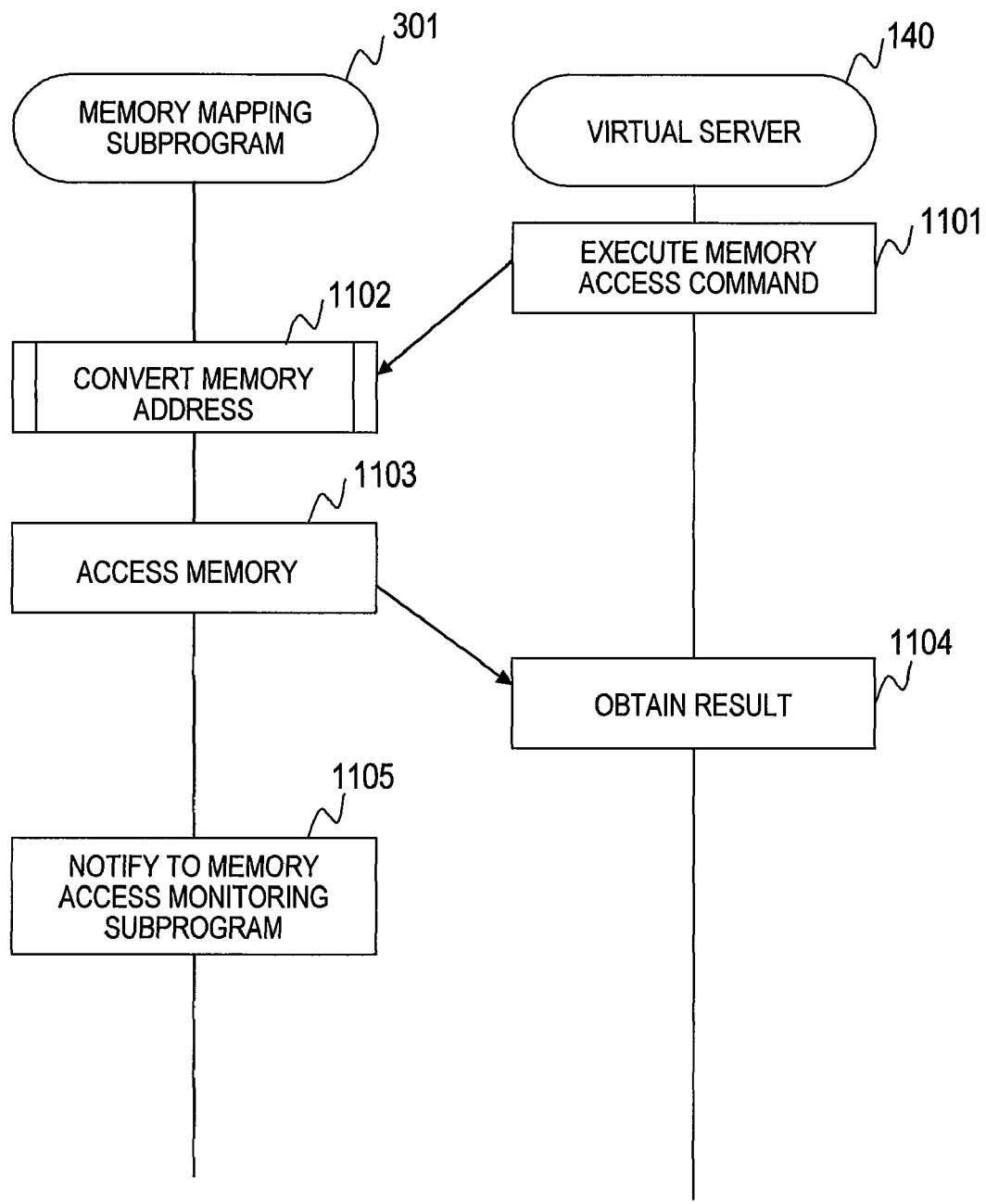
FIG. 11 is a sequence diagram showing a process of a memory mapping subprogram and a virtual server in accordance with the first embodiment of this invention.

FIG. 11 illustrates a processing sequence of the memory mapping subprogram 301 and the virtual server 140 according to the first embodiment of this invention.

First, in Step 1101, the virtual server 140 executes a memory access command. An OS, a driver, or the like on the virtual server 140 primarily issues a memory access command. A type of command may be a writing command or a reading command.

In Step 1102, after issuance of the memory access command in Step 1101, the memory mapping subprogram 301 converts the memory address. The memory address conversion will be described later in detail referring to FIG. 13.

In Step 1103, the memory mapping subprogram 301 accesses the memory address converted in Step 1102.

In Step 1104, the virtual server 140 receives a result of the memory access command issued in Step 1101.

In Step 1105, memory access information is notified to the memory access monitoring subprogram 302. In this case, the memory access information is a type of access such as writing or reading, or a memory capacity used for accessing.

Figure 15:
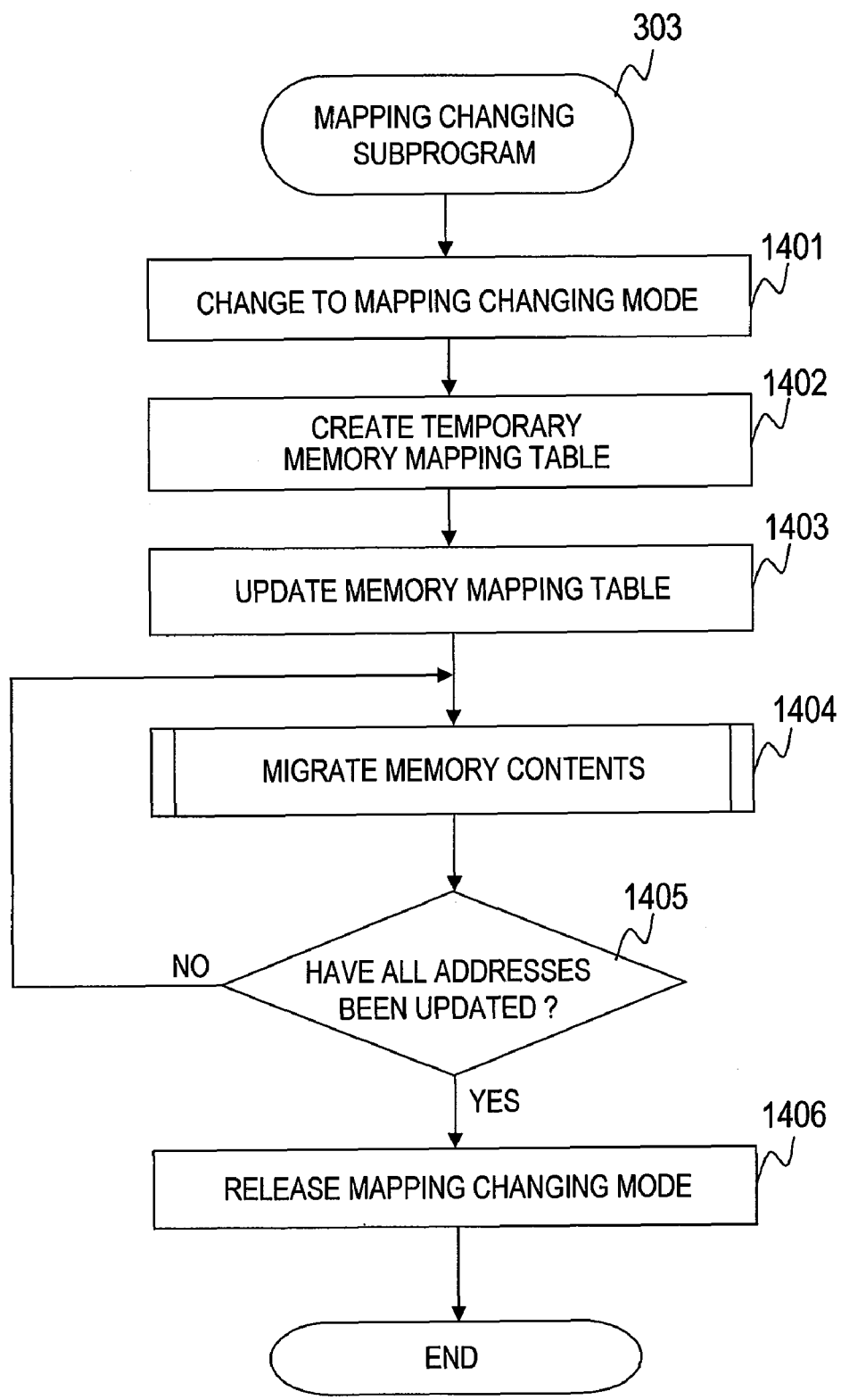
FIG. 15 is a flowchart showing a process of a mapping changing subprogram in accordance with the first embodiment of this invention.

FIG. 12 illustrates a temporary mapping table created in Step 1402 of a process of a mapping changing subprogram shown in FIG. 15 according to the first embodiment of this invention.

The temporary mapping table includes a memory chip 1601, a memory chip address 1602, an allocation destination 1603, a virtual server address 1604, and an updated address 1605.

The components of the memory chip 1601 to the virtual server address 1604 correspond to those of the memory chip 501 to the virtual server address 504 of the memory mapping table 310 shown in FIG. 5. For contents stored in the allocation destination 1603, "MIGRATION SOURCE" and "MIGRATION DESTINATION" are added as pieces of information indicating a migration source and a migration destination of memory contents.

The updated address 1605 is an address area of the virtual server 140 where migration of memory contents has been completed.

Figure 13:
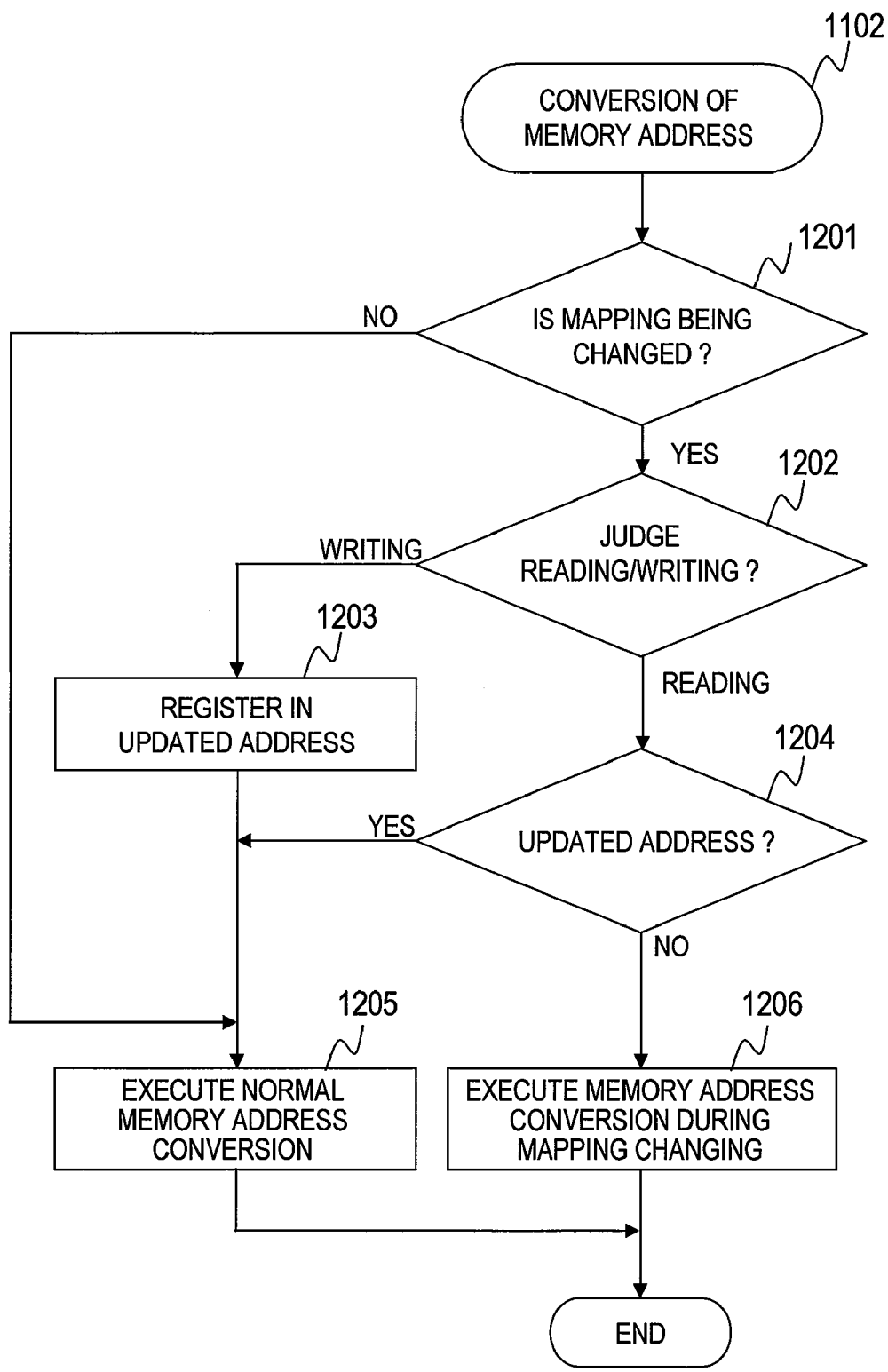
FIG. 13 is a flowchart showing a process of a memory address conversion in accordance with the first embodiment of this invention.

FIG. 13 is a flowchart of a process of the memory address conversion 1102 according to the first embodiment of this invention.

The memory address conversion process is carried out after the virtual server 140 issues the memory access command in Step 1101 of FIG. 11.

First, in Step 1201, the memory mapping subprogram 301 judges whether mapping of the memory 131 is being changed. A flag indicating on-going changing of mapping is held in the memory 131 by the virtualization module 150. Whether mapping is being changed is judged based on this held flag. The flag is updated by the mapping changing subprogram 303 shown in FIG. 3. The process proceeds to Step 1202 if the mapping is being changed. The process proceeds to Step 1205 if the mapping is not being changed.

In Step 1202, the memory mapping subprogram 301 judges which of reading command and writing command a type of the memory access command is. The process proceeds to Step 1204 in the case of the reading command. The process proceeds to Step 1203 in the case of the writing command.

In Step 1203, the memory mapping subprogram 301 registers an address area of a writing destination of the writing command in the updated address 1605 of the temporary memory mapping table shown in FIG. 12.

In Step 1204, the memory mapping subprogram 301 judges whether a reading destination address has been registered in the updated address 1605 of FIG. 12. If the reading destination address has been registered, the process proceeds to Step 1205. If not registered, the process proceeds to Step 1206.

In Step 1205, the memory mapping subprogram 301 refers to the memory mapping table 310 to retrieve an identifier of a virtual server 140 of a memory access source from the allocation destination 503, and an address of an access destination of the memory access command from addresses of virtual servers 140 indicated in the virtual server address 504. The memory mapping subprogram 301 takes out a memory chip 401 of the memory chip 504 corresponding to the retrieved record and an address of the memory chip address 502 to convert a memory address.

In Step 1206, the memory mapping subprogram 301 refers to the temporary memory mapping table shown in FIG. 12 to retrieve an identifier of the virtual server 140 of the memory access source from the allocation destination 1603, and an address of the access destination of the memory access command from addresses of virtual servers 140 indicated in the virtual server address 1604. The memory mapping subprogram 301 takes out a memory chip 401 of the memory chip 1601 corresponding to the retrieved record and an address of the memory chip address 1602 to convert a memory address. When an identifier of the virtual server 140 is retrieved from the allocation destination 1603, an identifier of a virtual server 140 of "MIGRATION SOURCE" is retrieved.

Figure 14:
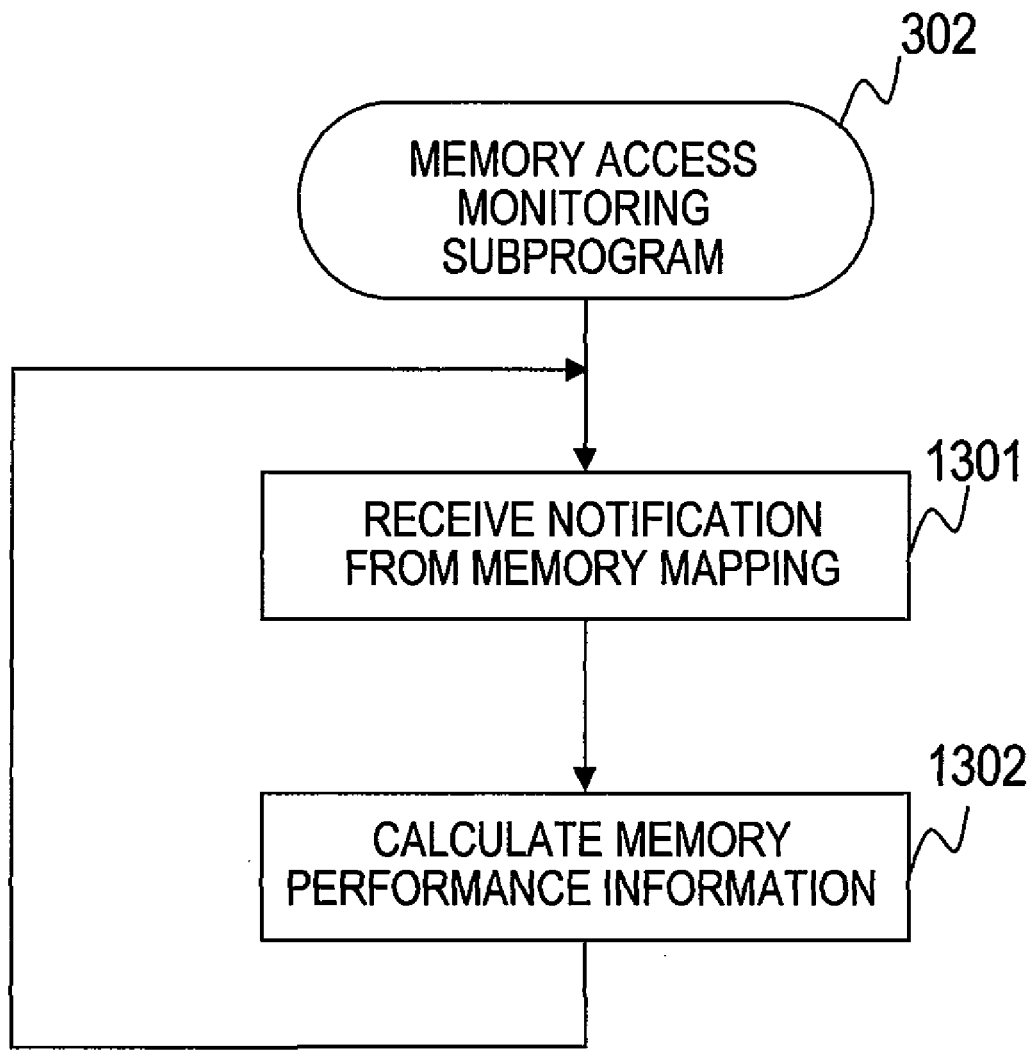
FIG. 14 is a flowchart showing a process of a memory access monitoring subprogram in accordance with the first embodiment of this invention.

FIG. 14 is a flowchart of a process of the memory access monitoring subprogram 302 according to the first embodiment of this invention.

First, in Step 1301, the memory access monitoring subprogram 302 receives memory access information from the memory mapping subprogram 301.

In Step 1302, the memory access monitoring subprogram 302 calculates memory performance information from the memory access information received in Step 1301, and holds a result of the calculation. The memory performance information is, for example, a memory access frequency calculated from information of an interval between last access and current access, memory throughput, a paging frequency, or the number of paging times. Then, the process returns to Step 1301.

FIG. 15 is a flowchart of a process of the mapping changing subprogram 303 according to the first embodiment of this invention. This process is started upon reception of a mapping changing instruction from the management server 101.

First, in Step 1401, the mapping changing subprogram 303 updates a flag indicating on-going mapping changing, and sets the flag to change to a mapping changing mode.

In Step 1402, based on an identifier of a virtual server 140 whose mapping is changed, an address area of a current mapping destination memory chip 401, and an address area of a mapping changing destination memory chip 401, the mapping changing subprogram 303 takes out information regarding the memory chip 401 and the virtual server 140 from the memory mapping table 310 shown in FIG. 5 to create a temporary memory mapping table shown in FIG. 12. For example, when mapping of "VIRTUAL SERVER 2" is changed from an address area "80000000h-BFFFFFFFh" of "MEMORY CHIP 1" to an address area "300000000h-33FFFFFFFh" of "MEMORY CHIP 4", the address area of the memory chip 501 and the memory chip address 502 shown in FIG. 5 is taken out to be stored in the memory chip 1601 and the memory chip address 1602 of FIG. 12.

In the allocation destination 1603 of FIG. 12, "MIGRATION SOURCE VIRTUAL SERVER 2" is stored for a current mapping destination address area "80000000h-BFFFFFFFh" and "MIGRATION DESTINATION VIRTUAL SERVER 2" is stored regarding for a mapping changing destination address area "300000000H-33FFFFFFFh".

In the virtual server address 1604 of FIG. 12, among the virtual server addresses 504 shown in FIG. 5, "0h-3FFFFFFFh" where the address area of "VIRTUAL SERVER 2" has been taken out is stored. In the updated address 1605 of FIG. 12, no value is stored at this time.

In Step 1403, the mapping changing subprogram 303 updates the memory mapping table 310. In this case, based on an identifier of a virtual server 140 whose mapping is to be changed, an address area of a current mapping destination memory chip 401, and an address area of a mapping changing destination memory chip 401, the mapping changing subprogram 303 updates the memory mapping table 310 to a status after mapping changing. When information is read from the memory mapping table 310 during the mapping changing, a status combining the memory mapping table 310 with the temporary memory mapping table is obtained.

In Step 1404, the mapping changing subprogram 303 migrates memory contents. The memory contents migration process will be described later in detail referring to FIG. 16.

In Step 1405, the mapping changing subprogram 303 judges whether migration of contents of all mapping changing addresses of the memory 131 have been completed. Specifically, the mapping changing subprogram 303 judges whether the updated address 1605 of FIG. 12 matches all the address areas of the addresses of the virtual servers indicated in the virtual server address 1604. If migration of the address contents has been completed, the process proceeds to Step 1406. If migration of the address contents has not been completed, the process repeats Step 1404.

In Step 1406, the mapping changing subprogram 303 updates the flag indicating on-going mapping changing, and drops the flag to release the mapping changing mode.

Figure 16:
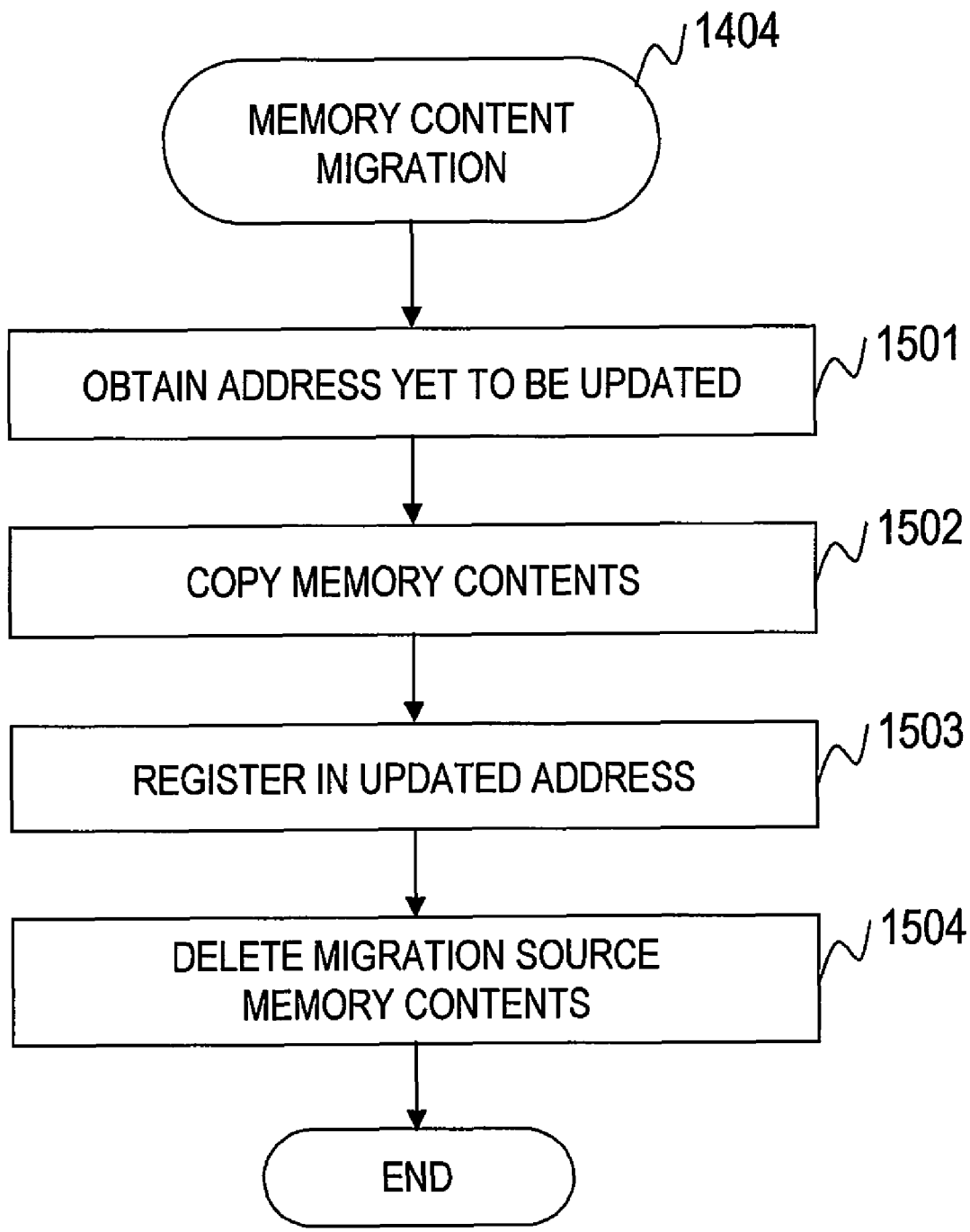
FIG. 16 is a flowchart showing a process of a memory content migration in accordance with the first embodiment of this invention.

FIG. 16 is a flowchart of a process of the memory content migration 1404 according to the first embodiment of this invention.

The memory content migration process is executed after the memory mapping table is updated in Step 1403 of FIG. 15.

First, in Step 1501, the mapping changing subprogram 303 obtains an address area of the virtual server 140 excluding the updated address of the updated address 1605 of FIG. 12.

In Step 1502, the mapping changing subprogram 303 copies memory contents corresponding to the address area obtained in Step 1501 from a migration source memory address area to a migration destination memory address area. In this case, the migration source memory address area and the migration destination memory address area are obtained from the allocation destination 1603 and the memory chip address 1602 shown in FIG. 12.

In Step 1503, the mapping changing subprogram 303 stores the address area to which the memory contents have been copied in Step 1502 in the updated address 1605 of FIG. 12.

In Step 1504, the mapping changing subprogram 303 deletes the memory contents copied in Step 1502 from the copy source (migration source). In Step 1504, the memory contents of the migration source don't always have to be deleted.

Figure 17:
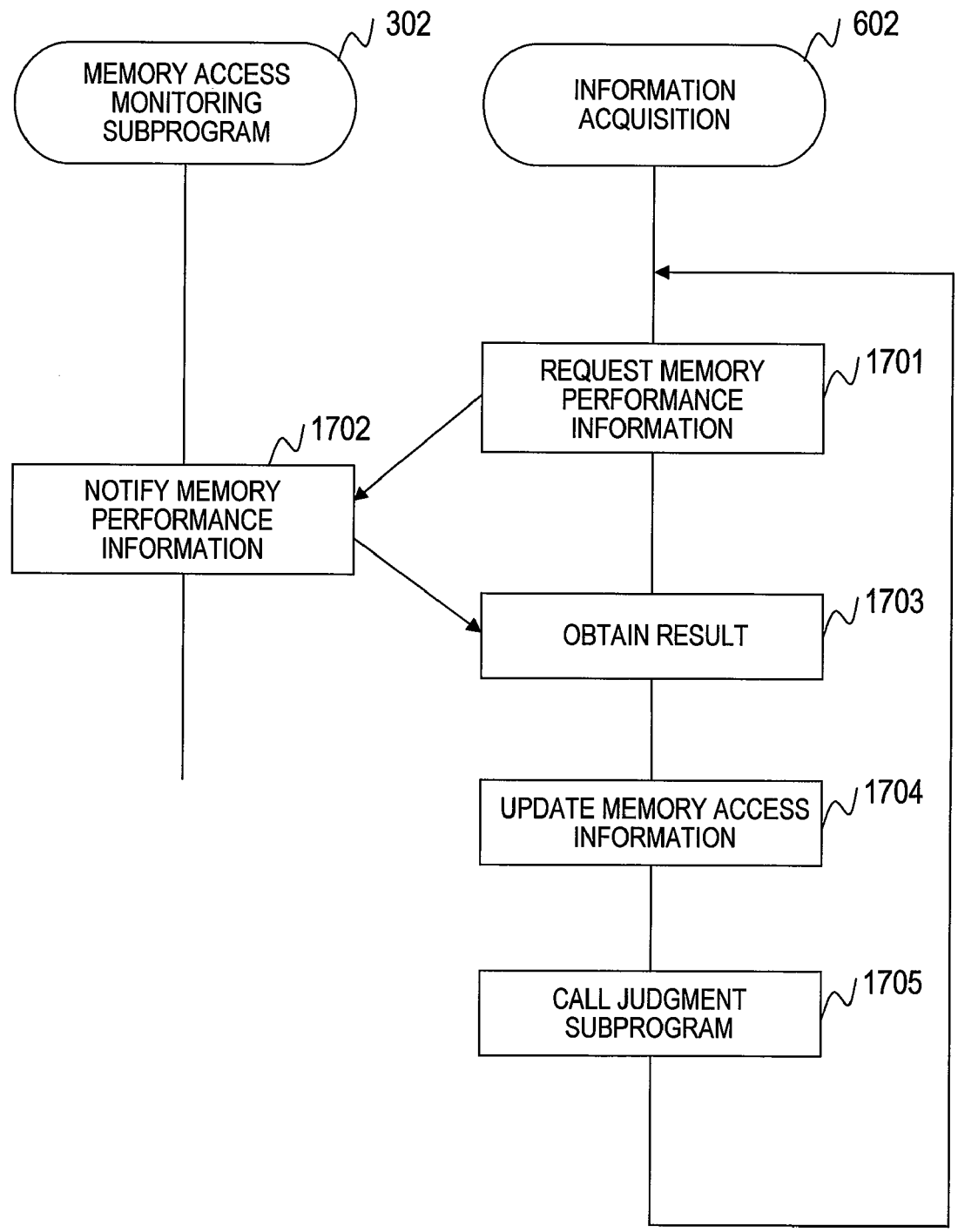
FIG. 17 a sequence diagram showing a process of a memory access monitoring subprogram and an information acquisition subprogram in accordance with the first embodiment of this invention.

FIG. 17 illustrates a processing sequence of the memory access monitoring subprogram 302 and the information acquisition subprogram 602 according to the first embodiment of this invention.

First, in Step 1701, the information acquisition subprogram 602 requests memory performance information to the memory access monitoring subprogram 302.

In Step 1702, upon reception of the memory performance information request from the information acquisition subprogram 602, the memory access monitoring subprogram 302 notifies held memory performance information to the information acquisition subprogram 602. The memory performance information notified to the information acquisition subprogram 602 is a value calculated in Step 1302 of FIG. 14.

In Step 1703, the information acquisition subprogram 602 obtains the memory performance information from the memory access monitoring subprogram 302.

In Step 1704, based on the memory performance information obtained in Step 1703, the information acquisition subprogram 602 updates the memory access information 704 of the virtual server management table 610. Specifically, "HIGH" is stored in the memory access information 704 if a value of the memory performance information is equal to or more than a predetermined threshold value. "LOW" is stored in the memory access information 704 if the value is equal to or less than a predetermined threshold value.

For the threshold value, a fixed value may be held. The user may set the threshold value by using the input device 205. One or more threshold values including a first threshold value and a second threshold value are held. If the value of the memory performance value is equal to or more than the first threshold value, "HIGH" can be stored in the memory access information 704. If the value is equal to or less than the second threshold value, "LOW" can be stored in the memory access information 704.

According to the first embodiment of this invention, the memory performance information is an access frequency. Even in the case of the power saving status of the memory chip 401, if memory access is a memory access frequency of no delay, "LOW" is stored in the memory information 704. If memory access is a memory access frequency of delays, "HIGH" is stored in the memory access information 704. The memory access information indicated by the memory access information 704 does not always need to have two values "HIGH" and "LOW". Alternatively, three or more values may be stored.

In Step 1705, the information acquisition subprogram 602 calls the judgment subprogram 603. Then, the process returns to Step 1701.

Figure 18:
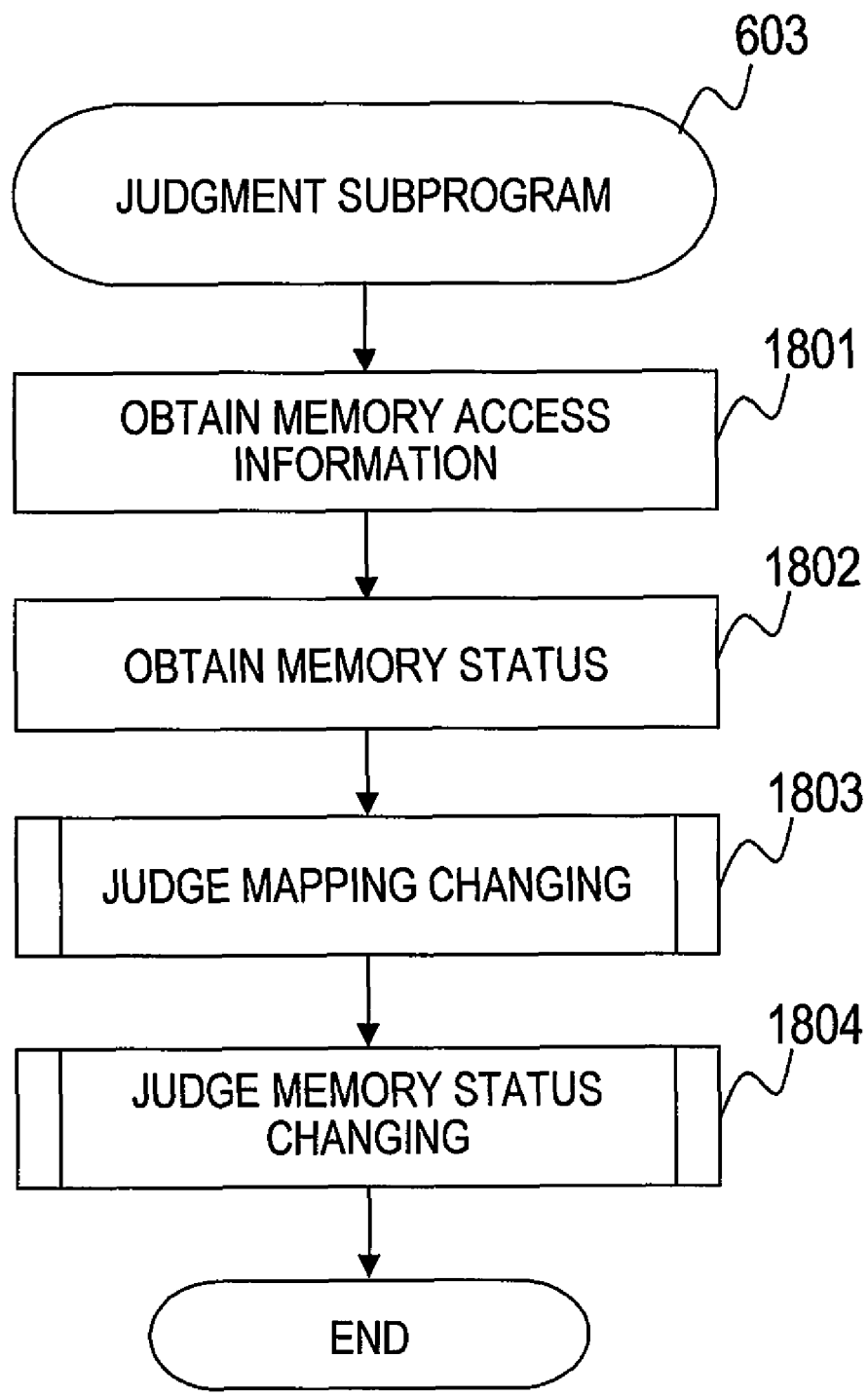
FIG. 18 is a flowchart showing a process of a judgment subprogram in accordance with the first embodiment of this invention.

FIG. 18 is a flowchart of a process of the judgment subprogram 603 according to the first embodiment of this invention.

First, in Step 1801, the judgment subprogram 603 obtains memory access information 704 from the virtual server management table 610.

Next, in Step 1802, the judgment subprogram 603 obtains the status 804 of the memory 131 from the memory management table 611.

In Step 1803, the judgment subprogram 603 judges whether to change mapping of the virtual server 140. If necessary, the mapping of the virtual server 140 is changed. The process of mapping changing judgment will be described below in detail referring to FIG. 19.

In Step 1804, the judgment subprogram 603 judges whether to change the status 804 of the memory 131. If necessary, the status 804 of the memory 131 is changed. The process of the memory status changing judgment will be described below in detail referring to FIG. 20.

Figure 19:
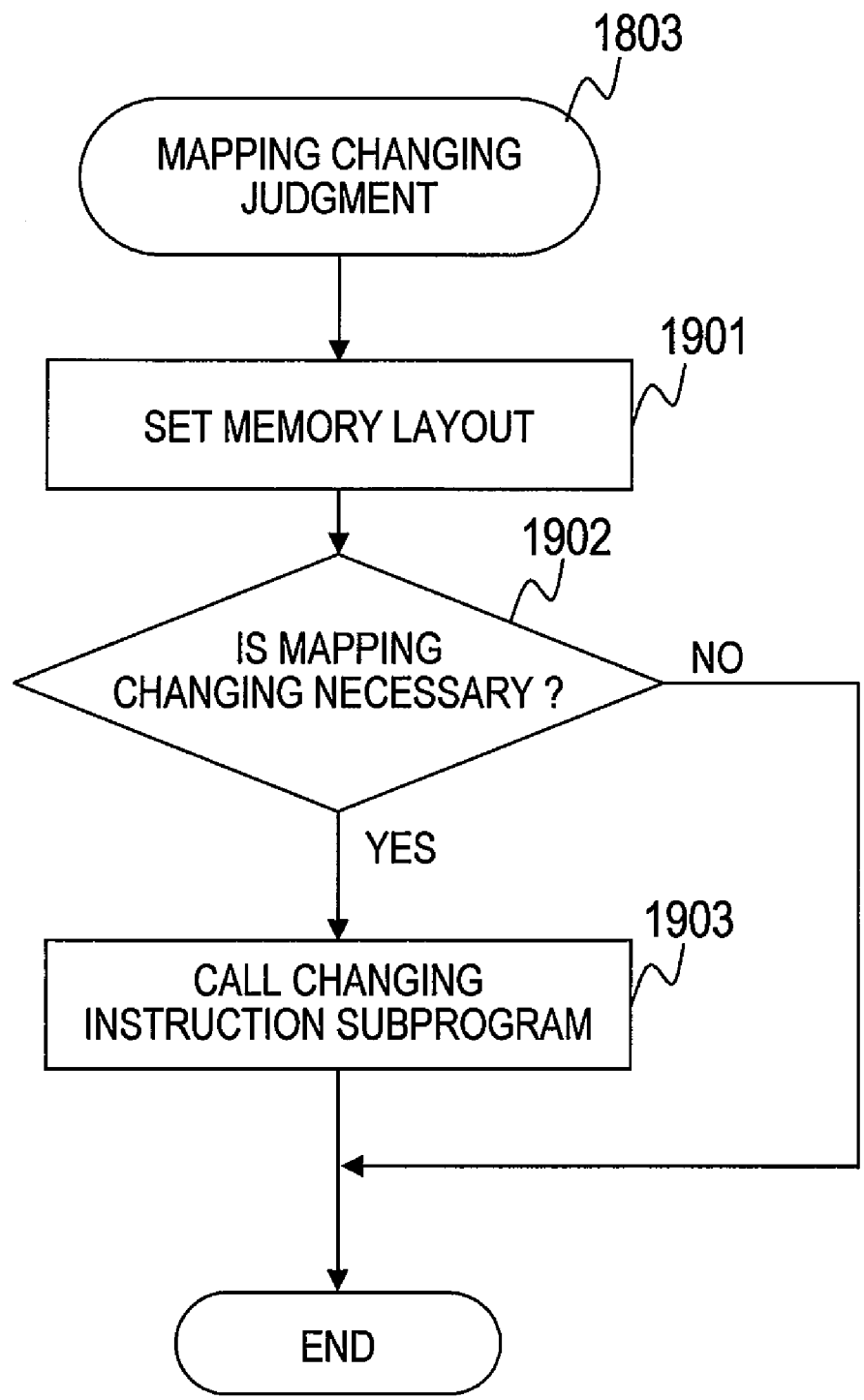
FIG. 19 is a flowchart showing a process of a mapping changing judgment in accordance with the first embodiment of this invention.

FIG. 19 is a flowchart of the process of the mapping changing judgment 1803 according to the first embodiment of this invention.

The process of the mapping changing judgment 1803 is carried out after a status of the memory 131 is obtained in Step 1802 of FIG. 18.

First, in Step 1901, the judgment subprogram 603 decides which of the memory chips 401 is laid out with an area of the memory 131 used by the virtual server 140.

Specifically, a layout is set based on the following two conditions: (1) a status, where the virtual server 140 of "HIGH" and the virtual server 140 of "LOW" of the memory access information 704 of the virtual server management table 610 shown in FIG. 7 use the same memory chip 401, is minimized, and (2) a capacity of changing current allocation of the memory 131 of the virtual server 140 is minimized.

Those conditions can be changed or deleted, and new conditions can be added by the user. Priority can be set for the conditions. For example, as to the conditions (1) and (2), priority is set so that the condition (1) comes first.

The layout is set by referring to the virtual server management table 610 and the memory management table 611. For example, in the examples of FIGS. 7 and 8, "VIRTUAL SERVER 1" and "VIRTUAL SERVER 2" have "HIGH" and "LOW" set in the memory access information 704, respectively, and are allocated to the same "MEMORY CHIP 1". Thus, the condition "1" is not satisfied.

The memory access information 704 of "VIRTUAL SERVER 4" is "LOW", and is allocated to "MEMORY CHIP 4". A capacity 802 of "MEMORY CHIP 4" is "4 GB", and memory use capacities 703 of "VIRTUAL SERVER 2" and "VIRTUAL SERVER 4" are "1 GB" and "3 GB", respectively. Accordingly, a capacity is not exceeded even when the allocation destination memory chip 401 of "VIRTUAL SERVER 2" is changed to "MEMORY CHIP 4". Thus, when the allocation destination memory chip 401 of "VIRTUAL SERVER 2" is changed to "MEMORY CHIP 4", "VIRTUAL SERVER 1" and "VIRTUAL SERVER 2" are not allocated to the same memory chip 401. As a result, the condition (1) can be satisfied.

In Step 1902, the judgment subprogram 603 judges whether the layout set in Step 1901 is different from mapping of the memory chip 401 currently allocated to the virtual server 401. If the layout and the mapping are different, the process proceeds to Step 1903 judging that mapping has to be changed. On the other hand, if the layout and the mapping are similar to each other, the process is finished.

In Step 1903, in order to change to the layout set in Step 1901, the judgment subprogram 603 calls the changing instruction subprogram 604 by using an identifier of the virtual server 140 to be changed, a current allocation destination memory address area, and a changing destination memory address area as arguments. Then, the process is finished.

Figure 20:
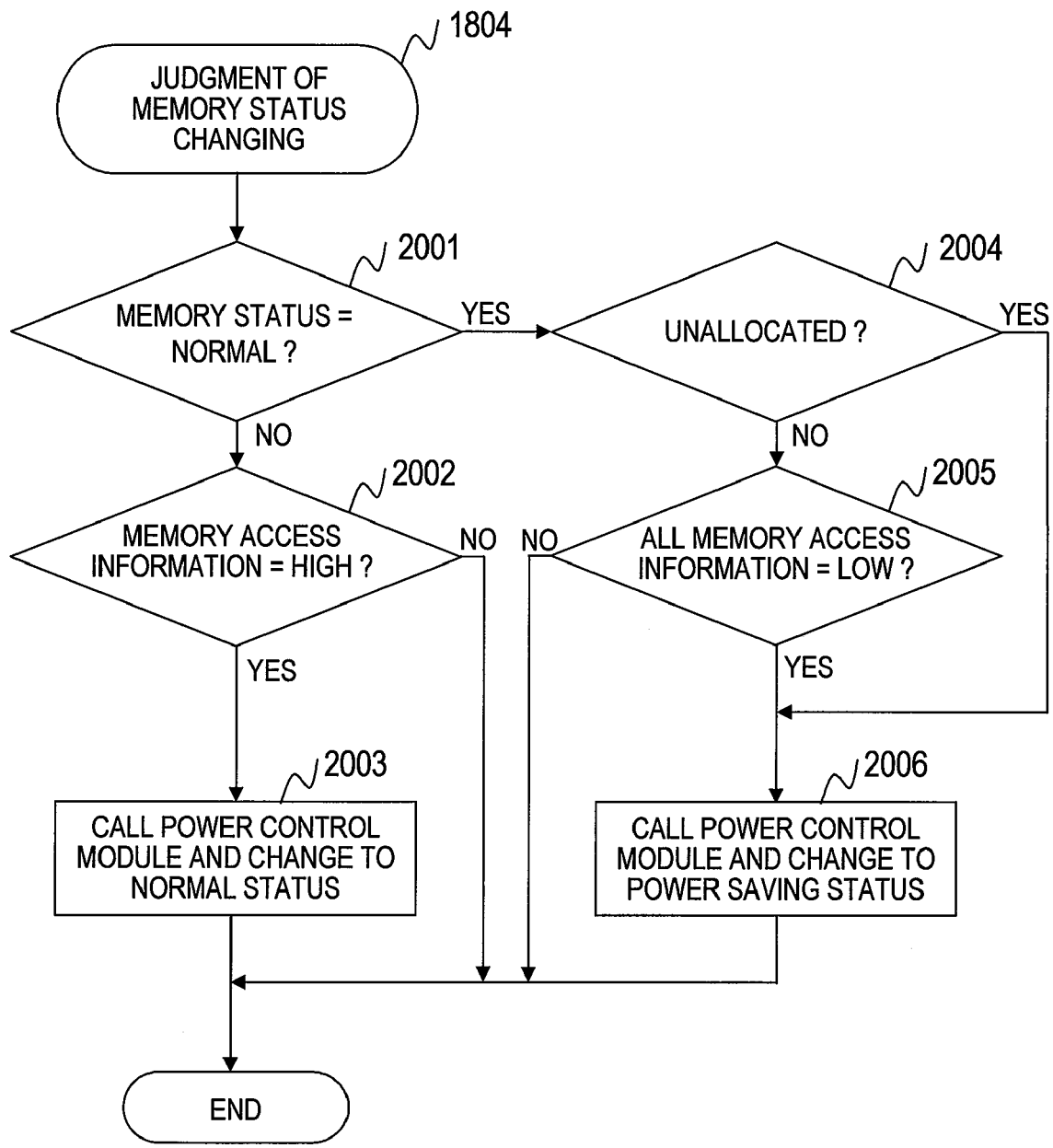
FIG. 20 is a flowchart showing a process of a memory status changing judgment in accordance with the first embodiment of this invention.

FIG. 20 is a flowchart of a process of the memory status changing judgment 1804 according to the first embodiment of this invention. This process is carried out after the judgment is made about whether mapping changed in Step 1803 shown in FIG. 18.

First, in Step 2001, the judgment subprogram 603 obtains a memory status 804 of the memory chip 401 from the memory management table 611 to judge whether a status is normal. If the status is normal, the process proceeds to Step 2004. On the other hand, if the status is not normal, the process proceeds to Step 2002.

In Step 2002, the judgment subprogram 603 obtains a memory chip allocation destination 803 from the memory management table 611, and pieces of memory access information 704 of virtual servers 140 of all the allocation destinations 803 from the virtual server management table 610. The judgment subprogram 603 judges whether virtual servers 140 whose memory access information 704 is "HIGH" are present among the obtained pieces of memory access information 704. If even one virtual server 140 having memory access information 704 of "HIGH" is present, the process proceeds to Step 2003. On the other hand, if no virtual server 140 whose memory access information 704 is "HIGH" is present, the process is finished.

In Step 2003, the judgment subprogram 603 calls the power control subprogram 605 to instruct changing of the status 804 of the memory chip 401 to a normal status. Then, the process is finished.

In Step 2004, the judgment subprogram 603 obtains an allocation destination 803 of the memory chip 401 from the memory management table 611 to judge whether it is an unallocated memory chip 401. In the case of an unallocated memory chip 401, the process proceeds to Step 2006. On the other hand, if the memory chip is not an unallocated memory chip 401, the process proceeds to Step 2005.

In Step 2005, the judgment subprogram 603 obtains an allocation destination 803 of the memory chip 401 from the memory management table 611, and pieces of memory access information 704 of virtual servers 140 of all the allocation destinations 803 from the virtual server management table 610. The judgment subprogram 603 judges whether all the obtained pieces of memory access information 704 of the virtual servers 140 are "LOW". If all the pieces of memory access information 704 of the virtual servers 140 are "LOW", the process proceeds to Step 2006. On the other hand, if any one of all the obtained pieces of memory access information 704 of the virtual servers 140 is "LOW", the process is finished.

In Step 2006, the judgment subprogram 603 calls the power control subprogram 605 to instruct changing of the status 804 of the memory chip 401 to a power saving status. It should be noted that the process (memory status changing judgment 1804) of FIG. 20 is carried out for all the memory chips 401.

Figure 21:
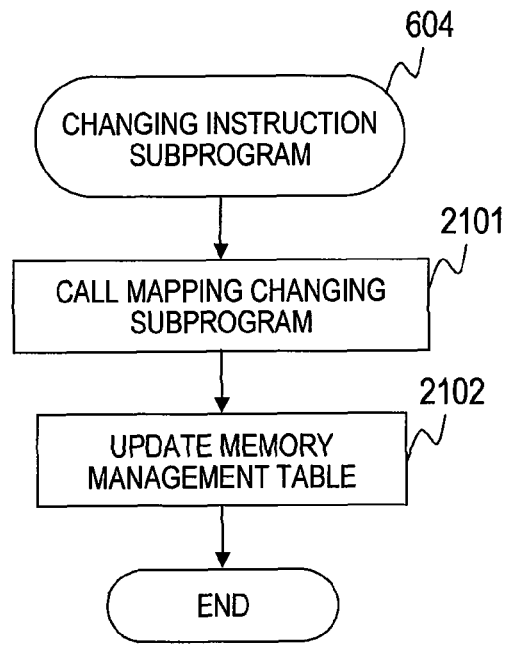
FIG. 21 is a flowchart showing a process of a changing instruction subprogram in accordance with the first embodiment of this invention.

FIG. 21 is a flowchart of a process of the changing instruction subprogram 604 according to the first embodiment of this invention.

First, in Step 2101, the changing instruction subprogram 604 calls the mapping changing subprogram 303 by using an identifier of a virtual server 140 to be changed, a current allocation destination memory address area, and a changing destination memory address area as arguments. Immediately after the execution of Step 2101, information indicating on-going mapping changing may be added to the memory management table 611.

Next, in Step 2102, the changing instruction subprogram 604 updates the memory management table 611 to a status after the mapping change.

Figure 22:
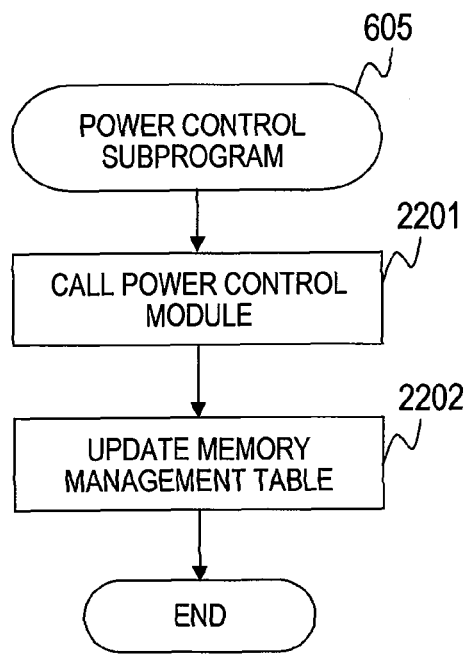
FIG. 22 is a flowchart showing a process of a power control subprogram in accordance with the first embodiment of this invention.

FIG. 22 is a flowchart of a process of the power control subprogram 605 according to the first embodiment of this invention.

First, in Step 2201, the power control subprogram 605 calls the power control module 135 by using an identifier of a memory chip 401 whose status is to be changed and a status after the change as arguments to change the status 804 of the memory chip 401.

Next, in Step 2202, the power control subprogram 605 updates the status 803 of the memory 131 of the memory management table 611.

Figure 23:
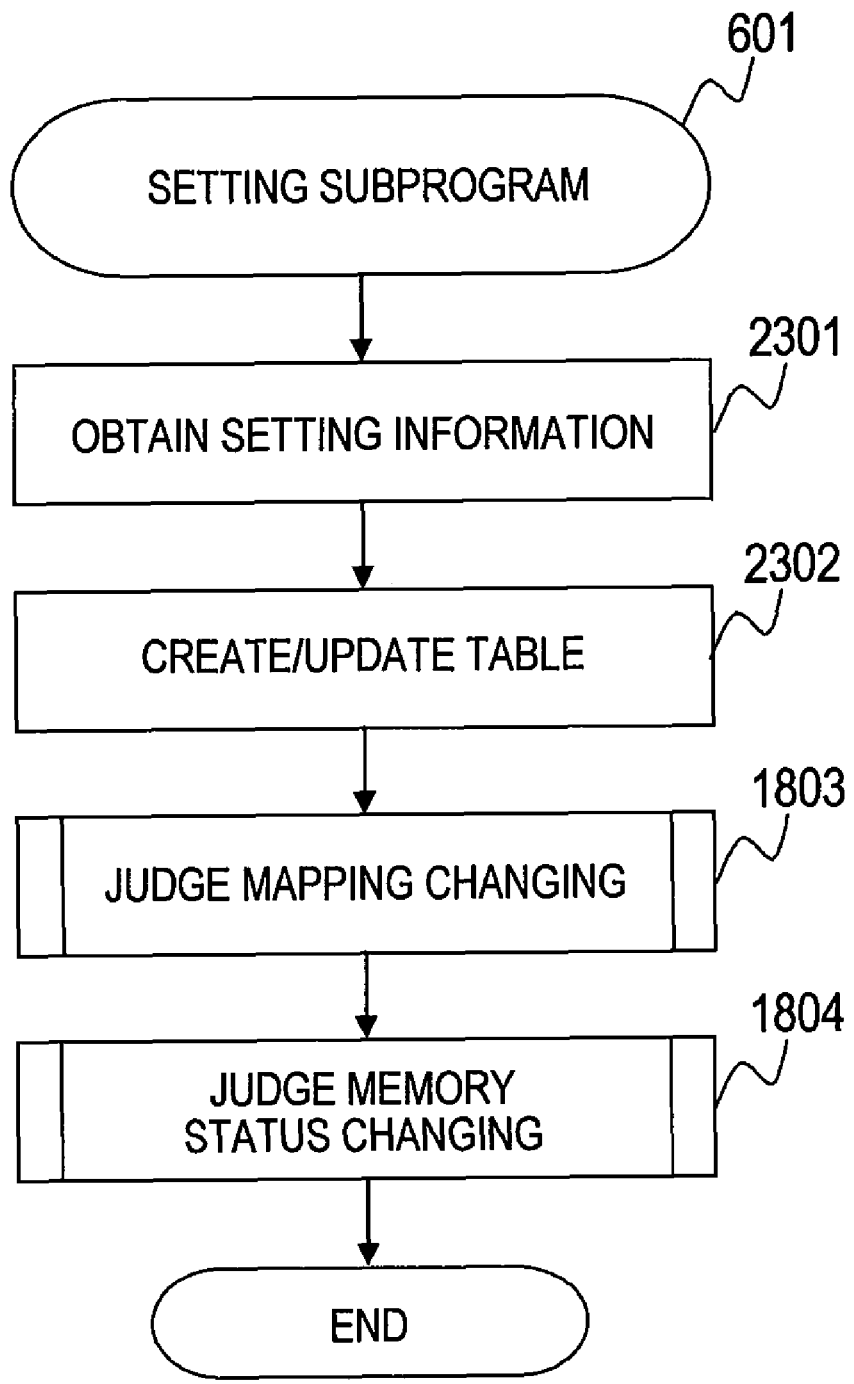
FIG. 23 is a flowchart showing a process of a setting subprogram in accordance with the first embodiment of this invention.

FIG. 23 is a flowchart of a process of the setting subprogram 601 according to the first embodiment of this invention.

The setting subprogram 601 is executed when a new virtual server 140 is set, a hardware or software configuration of the server 103 is changed, a configuration of the virtual server 140 is changed, or the user calls the setting subprogram 601. The power management program 110 includes means which enables the user to call the setting subprogram 601.

In Step 2301, the setting subprogram 601 obtains setting information (configuration information of the virtual server 140). As a method of obtaining the setting information, as shown in FIG. 10, there is a method which enables the administrator of the computer system to input the setting information by using the GUI provided from the power management program 110. A method that enables the user to input the setting information by using a command line provided from the power management program 110 may be used. A method of obtaining the setting information from a file saved in the storage system coupled to the management server 101 may be used. A method of obtaining the setting information via a network may be used.

In Step 2302, the setting subprogram 601 creates a virtual server setting table 612 shown in FIG. 9 based on the setting information obtained in Step 2301. In the memory access information 704 of the virtual server management table 610, a default status 903 of the virtual server setting table 612 is stored.

In other columns of the virtual server management table 610 and the memory management table 611, information may be obtained from the memory mapping table 310 of FIG. 5 to be stored. The obtained information may also be stored by a method via a GUI, a CLI, a file, or a network.

The Steps 1803 and 1804 are similar to Steps 1803 and 1804 shown in FIG. 18, and thus description thereof will be omitted.

Second Embodiment

According to a second embodiment of this invention, the virtualization module 150 of the first embodiment monitors a use situation of the CPU of the virtual server 140, and reflects the monitored use situation of the CPU in the memory access information 704 of the virtual server 140. The second embodiment of this invention enables control of mapping between the virtual server 140 and the memory chip 401 and control of a status of the memory chip 401 by taking not only the memory access information 704 of the virtual server 140 but also the use situation of the CPU into consideration.

Figure 24:
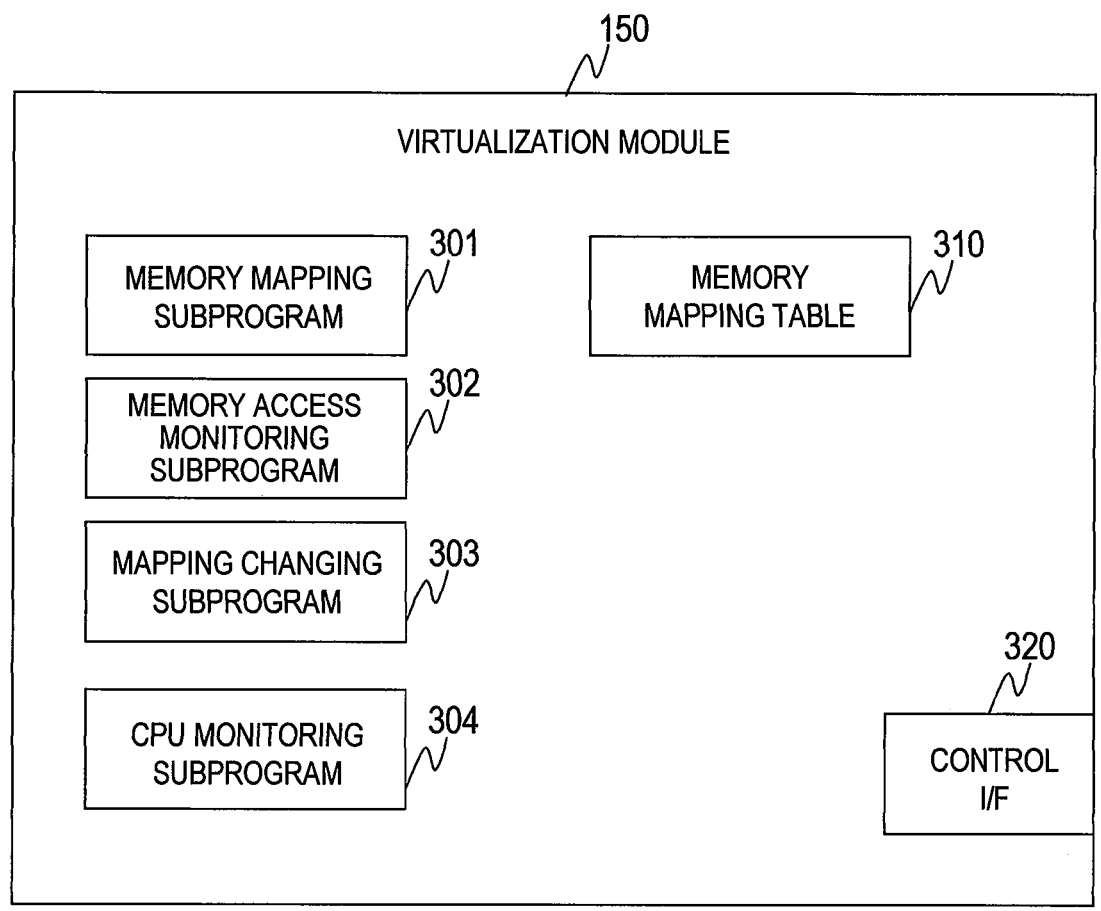
FIG. 24 an explanatory diagram showing a configuration of the virtualization module in accordance with a second embodiment of this invention.

FIG. 24 illustrates a configuration of the virtualization module 150 according to the second embodiment of this invention. The second embodiment is different from the first embodiment of this invention in that the virtualization module 150 includes a CPU monitoring subprogram 304.

The CPU monitoring subprogram 304 monitors a use situation of the CPU of the virtual server 140.

Figure 25:
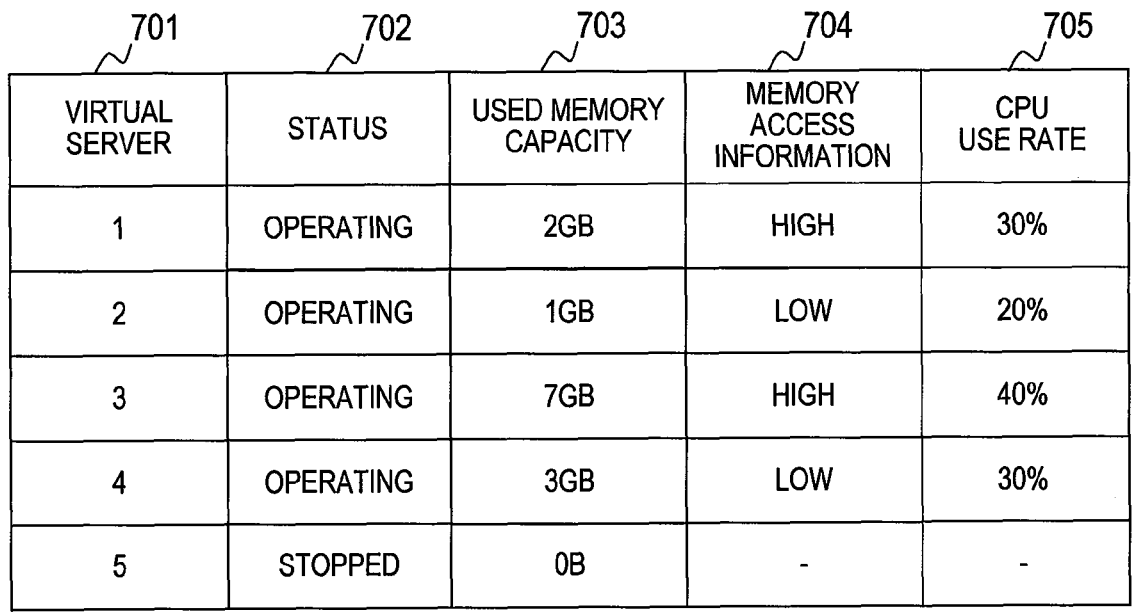
FIG. 25 is an explanatory diagram showing a configuration of a virtual server management table in accordance with the second embodiment of this invention.

FIG. 25 illustrates a virtual server management table 610 according to the second embodiment of this invention. The second embodiment is different from the first embodiment of this invention in that the virtual server management table 610 includes a CPU use rate 705.

The CPU use rate 705 indicates a use rate of a CPU used by a virtual server 140 indicated by a virtual server 701.

Figure 26:
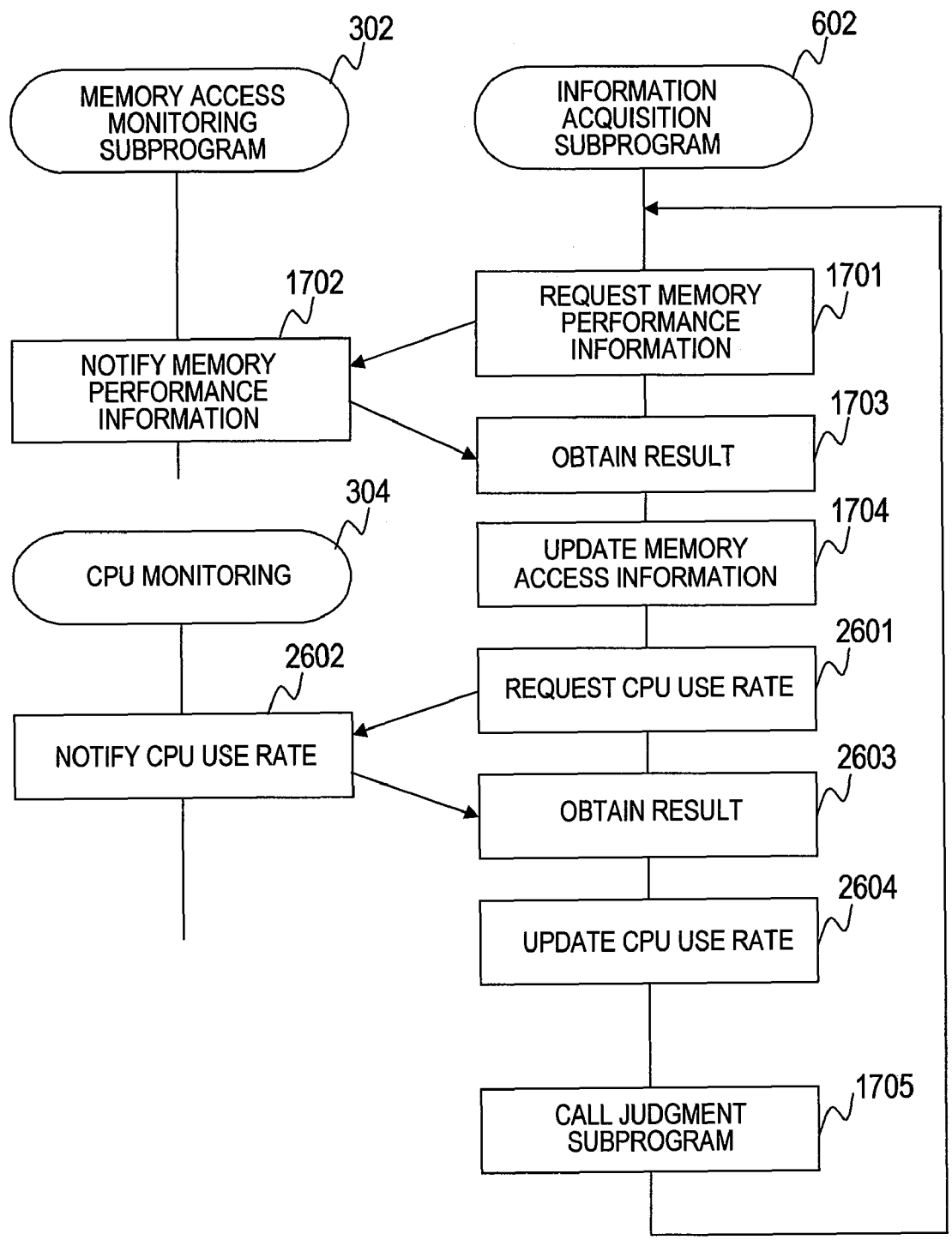
FIG. 26 a sequence diagram showing a process of a memory access monitoring subprogram, an information acquisition subprogram and the CPU monitoring subprogram in accordance with the second embodiment of this invention.

FIG. 26 illustrates a sequence of processes of a memory access monitoring subprogram 302, an information acquisition subprogram 602, and the CPU monitoring subprogram 304 according to the second embodiment of this invention.

The second embodiment is different from the first embodiment of this invention in that a sequence of the CPU monitoring subprogram 304 and Steps 2601 to 2604 are added.

A process of Steps 1701 to 1705 is similar to Steps 1701 to 1705 shown in FIG. 17, and thus description thereof will be omitted.

In Step 2601, the information acquisition subprogram 602 requests a CPU use rate to the CPU monitoring subprogram 304.

In Step 2602, upon reception of the request of the CPU use rate from the information acquisition subprogram 602 in Step 2601, the CPU monitoring subprogram 304 notifies the CPU use rate to the information acquisition subprogram 602. The CPU monitoring subprogram 304 monitors a CPU use rate of the virtual server 140 to hold information of the monitored CPU use rate.

In Step 2603, the information acquisition subprogram 602 obtains the CPU use rate from the CPU monitoring subprogram 304.

In Step 2604, the information acquisition subprogram 602 stores the CPU use rate obtained in Step 2603 in the CPU use rate 705 of the virtual server management table 610. Then, the process proceeds to Step 1705.

Figure 27:
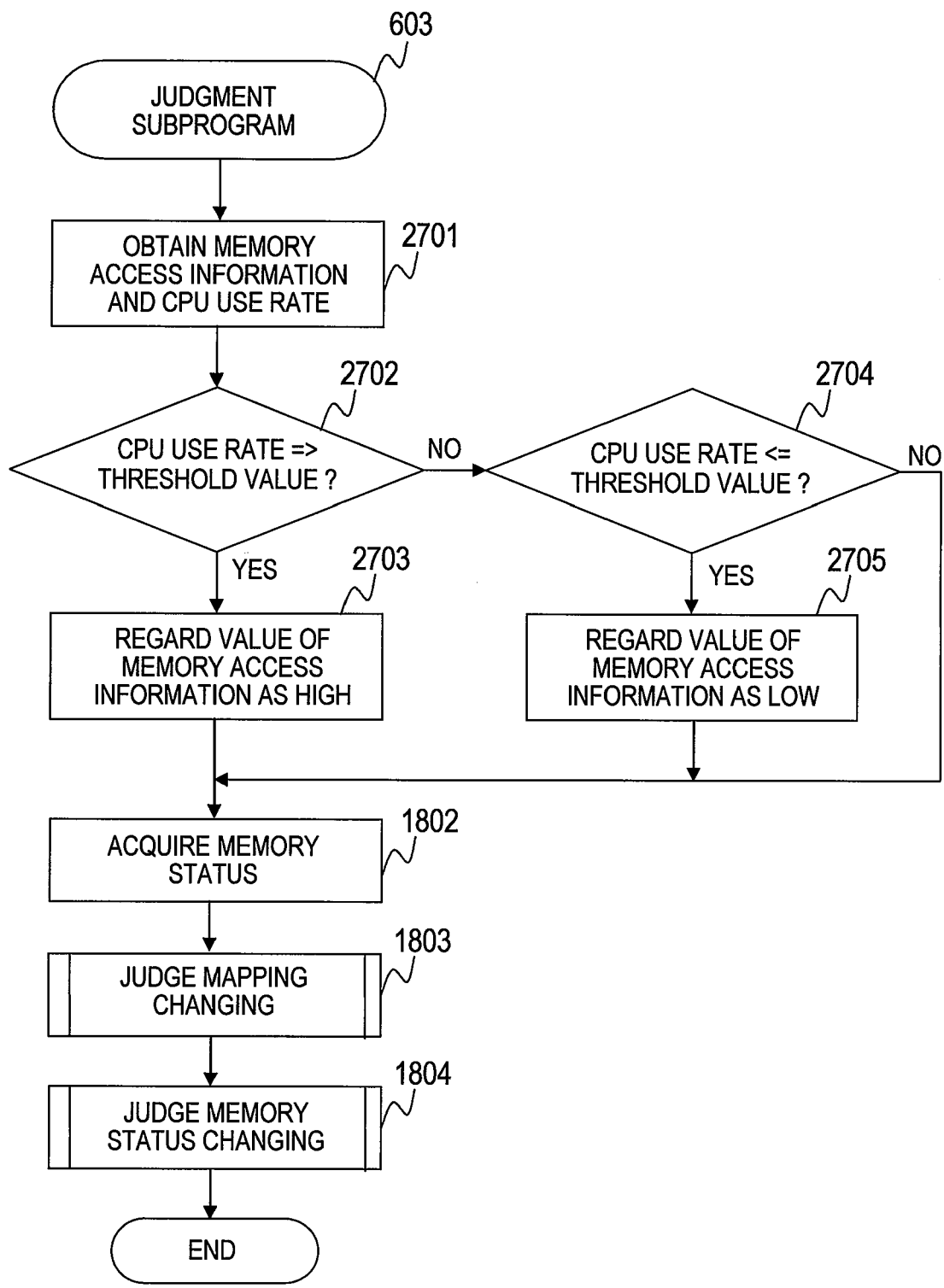
FIG. 27 is a flowchart showing a process of a judgment subprogram in accordance with the second embodiment of this invention.

FIG. 27 is a flowchart of a process of a judgment subprogram 603 according to the second embodiment of this invention.

The second embodiment is different from the first embodiment of this invention in that Steps 2701 to 2705 are added.

In Step 2701, the judgment subprogram 603 obtains the memory access information 704 and the CPU use rate 705 from the virtual server management table 610.

In Step 2702, the judgment subprogram 603 judges whether the CPU use rate 705 obtained in Step 2701 is equal to or more than a predetermined threshold value. If the CPU use rate 705 is equal to or more than the predetermined threshold value, the process proceeds to Step 2703. On the other hand, if the CPU use rate 705 is less than the predetermined threshold value, the process proceeds to Step 2704.

In Step 2703, the judgment subprogram 603 judges that the memory access information 704 obtained in Step 2701 is "HIGH". When the memory access information 704 is used in a process thereafter, a value of "HIGH" is used.

In Step 2704, the judgment subprogram 603 judges whether the CPU use rate 705 obtained in Step 2701 is equal to or less than a predetermined threshold value. If the CPU use rate 705 is equal to or less than the predetermined threshold value, the process proceeds to Step 2705. On the other hand, if the CPU use rate 705 is more than the predetermined threshold value, the process proceeds to Step 1802.

In Step 2705, the judgment subprogram 603 judges that the memory access information 704 obtained in Step 2701 is "LOW". When the memory access information 704 is used in a process thereafter, a value of "LOW" is used.

As the threshold value used in Steps 2702 and 2704, a fixed value set beforehand in the judgment subprogram 603 is used. A value inputted by a user via the input device 205 may also be used. The threshold values used in Steps 2702 and 2704 may be different from each other.

In Steps 2703 and 2705, when the memory access information 704 obtained in Step 2701 has two or more values, a step of judging "HIGH" or "LOW" according to each value may be added. For example, when the memory access information 704 is "VERY HIGH" as a value higher than "HIGH", "HIGH" rather than "LOW" may be judged in Step 2705. Thus, a method of correcting the memory access information 704 used in Steps 2703 and 2705 according to a relation between the CPU use rate and a memory access frequency may be judged.

Steps 1802 to 1804 are similar to Steps 1802 to 1804 shown in FIG. 18, and thus description thereof will be omitted.

Third Embodiment

According to a third embodiment of this invention, the virtualization module 150 of the first embodiment of this invention carries out swapping to enable arrangement of memory areas used by virtual servers 140 not only in a memory 131 but also in an auxiliary storage system 133. According to the second embodiment of this invention, by arranging a memory area of a low access frequency not in the memory but in the auxiliary storage system from the virtual server 140, a used memory capacity can be saved.

Figure 28:
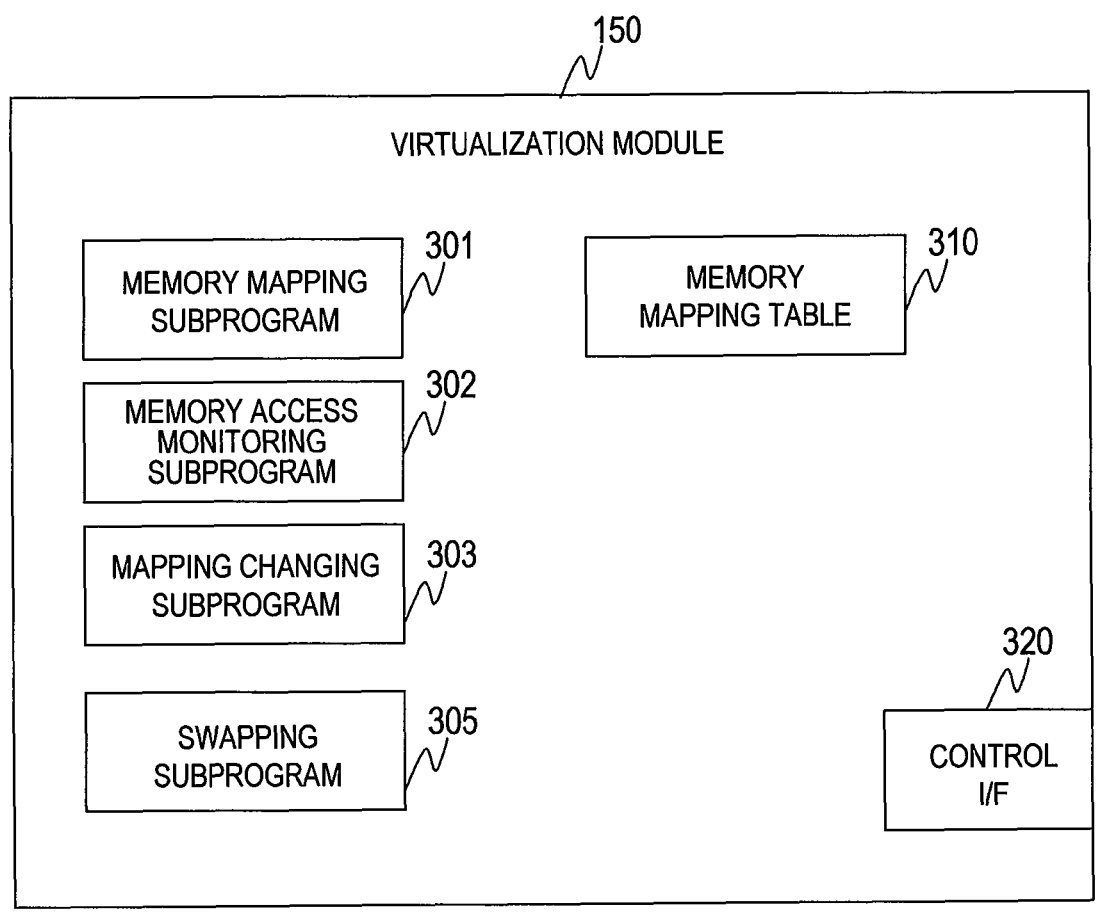
FIG. 28 an explanatory diagram showing a configuration of the virtualization module in accordance with a third embodiment of this invention.

FIG. 28 illustrates a configuration of the virtualization module 150 according to the third embodiment of this invention. The third embodiment is different from the first and second embodiments of this invention in that the virtualization module 150 includes a swapping subprogram 305.

The swapping subprogram 305 swaps in or swaps out a memory area used by the virtual server 140 between the memory 131 and the auxiliary storage system 133.

The swapping-in means that the same area as the area reserved in the auxiliary storage system 133 is reserved in the memory 131, and the same data as the data written in the memory area reserved in the auxiliary storage system 133 is written in the memory area reserved in the memory 131 to open the memory area of the auxiliary storage system 133.

The swapping-out means that the same memory area as the memory area reserved in the memory 131 is reserved in the auxiliary storage system 133, and the same data as the data written in the memory area reserved in the memory 131 is written in the memory area reserved in the auxiliary storage system 133 to open the memory area of the memory 131.

Figure 29:
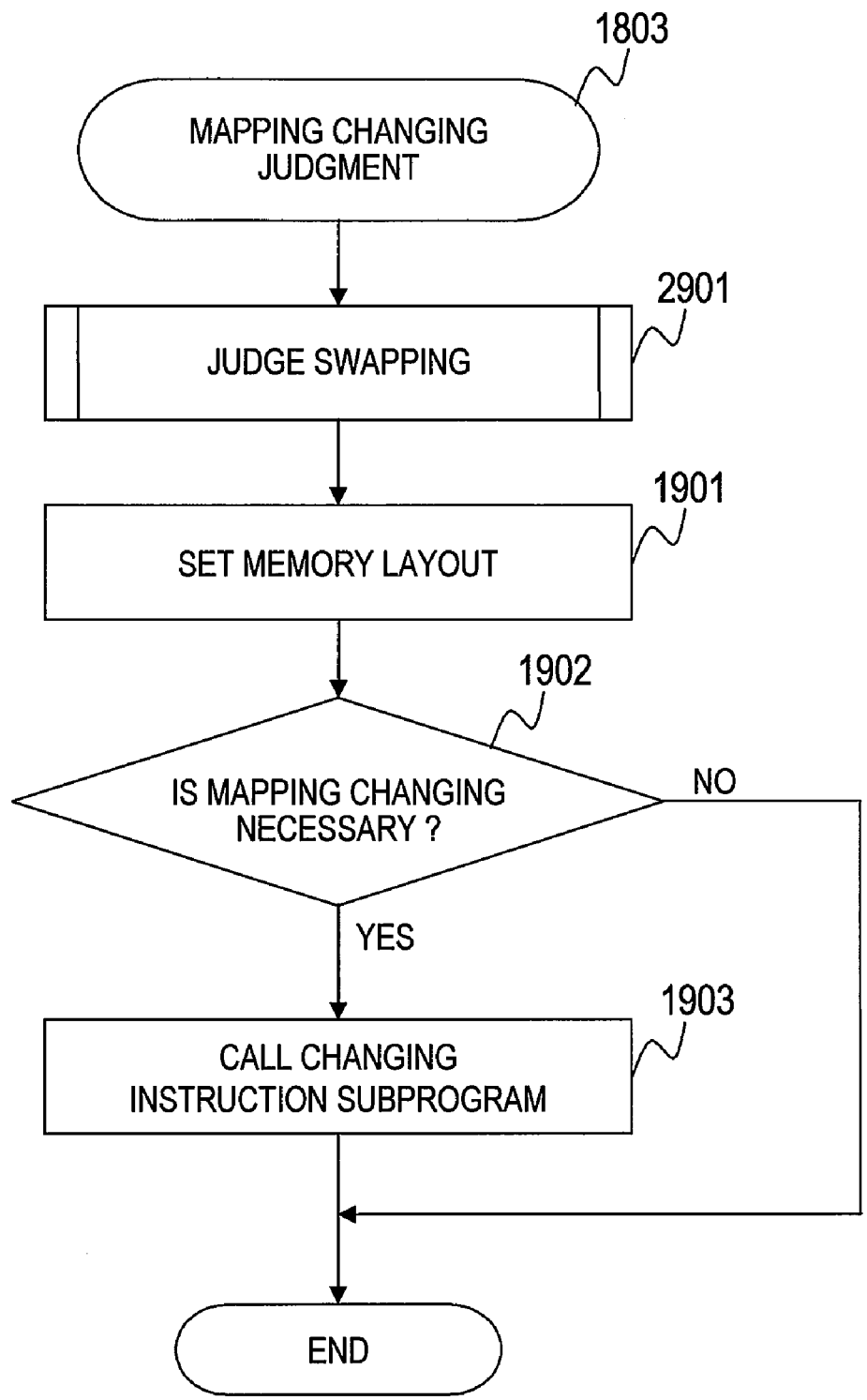
FIG. 29 is a flowchart showing a process of a mapping changing judgment in accordance with the third embodiment of this invention.

FIG. 29 is a flowchart of a process of mapping changing judgment 1803 according to the third embodiment of this invention. The third embodiment is different form the first and second embodiments of this invention in that Step 2901 is added.

In Step 1901, for a memory area used by each virtual server 140, whether to swap in or swap out a part or all of the memory areas in the auxiliary storage system 133 is judged. If necessary, the swapping-in or swapping-out is carried out. The process of swapping judgment will be described below in detail referring to FIG. 30.

Figure 30:
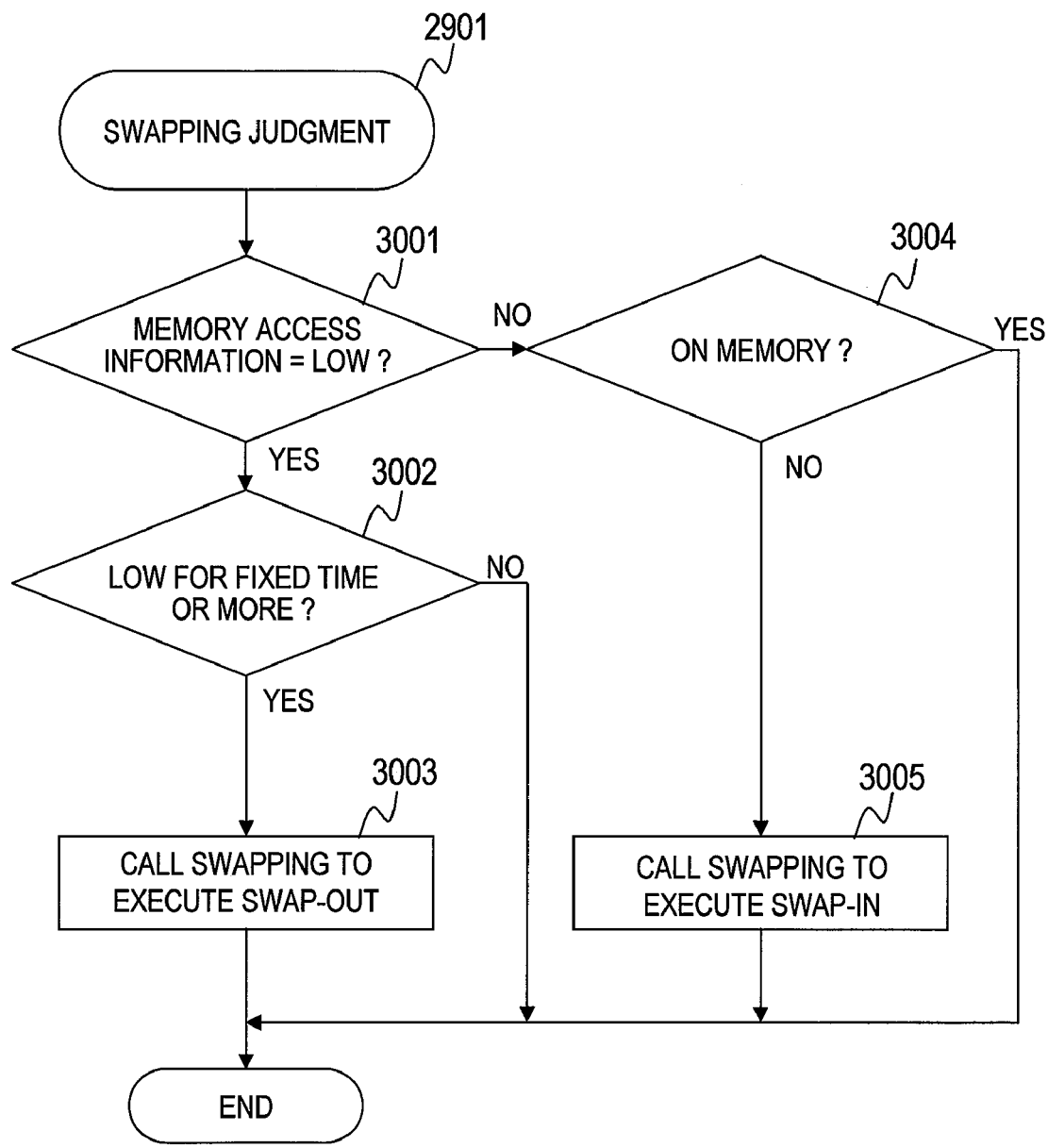
FIG. 30 is a flowchart showing a process of a swapping judgment in accordance with the third embodiment of this invention.

FIG. 30 is a flowchart of a process of the swapping judgment 2901 according to the third embodiment of this invention.

First, in Step 3001, the judgment subprogram 603 obtains the memory access information 704 of the virtual server management table 601 of the virtual server 140, and judges whether the obtained memory access information 704 is "LOW". If the memory access information 704 is "LOW", the process proceeds to Step 3002. On the other hand, if the memory access information 704 is not "LOW", the process proceeds to Step 3004.

In Step 3002, the judgment subprogram 603 holds time when the memory access information 704 of the virtual server 140 is "LOW" to judge whether a status of "LOW" continues for a predetermined time or more. If the status of "LOW" continues for the predetermined time or more, the process proceeds to Step 3003. On the other hand, if the status is not "LOW" for the predetermined time, the process is finished.

In Step 3003, the judgment subprogram 603 instructs the swapping subprogram 305 to swap out a part or all of the memory areas used by the virtual server 140. Here, the swapping-out of a part of the memory area means, for example, that only an OS area of the virtual server 140 is left in the memory 131 to swap out a user area of the virtual server 140. When the auxiliary storage system 133 for storing the swapped-out information is a nonvolatile device, power supply to the auxiliary storage system 133 may be stopped.

In Step 3004, the judgment subprogram 603 judges whether a part or all of the memory areas used by the virtual server 140 are present in the memory. If the memory area is present in the memory, the process is finished. If no memory area is present in the memory 131, the process proceeds to Step 3005.

In Step 3005, the judgment subprogram 603 instructs the swapping subprogram 305 to swap in the memory area arranged in the auxiliary storage system 133. It should be noted that the process of the swapping judgment 2901 is carried out for all the virtual servers 140.

Fourth Embodiment

According to a fourth embodiment of this invention, the virtualization module 150 of the first embodiment of this invention accommodates a memory used among the virtual servers 140 to allocate an area equal to or more than a use capacity of a memory mounted in the server 103 to the virtual server 140. The fourth embodiment enables, when allocation of the memory 131 of the virtual server 140 is changed, changing of allocation of the memory 131 even if a capacity of a changing destination memory chip 401 is short.

Figure 31:
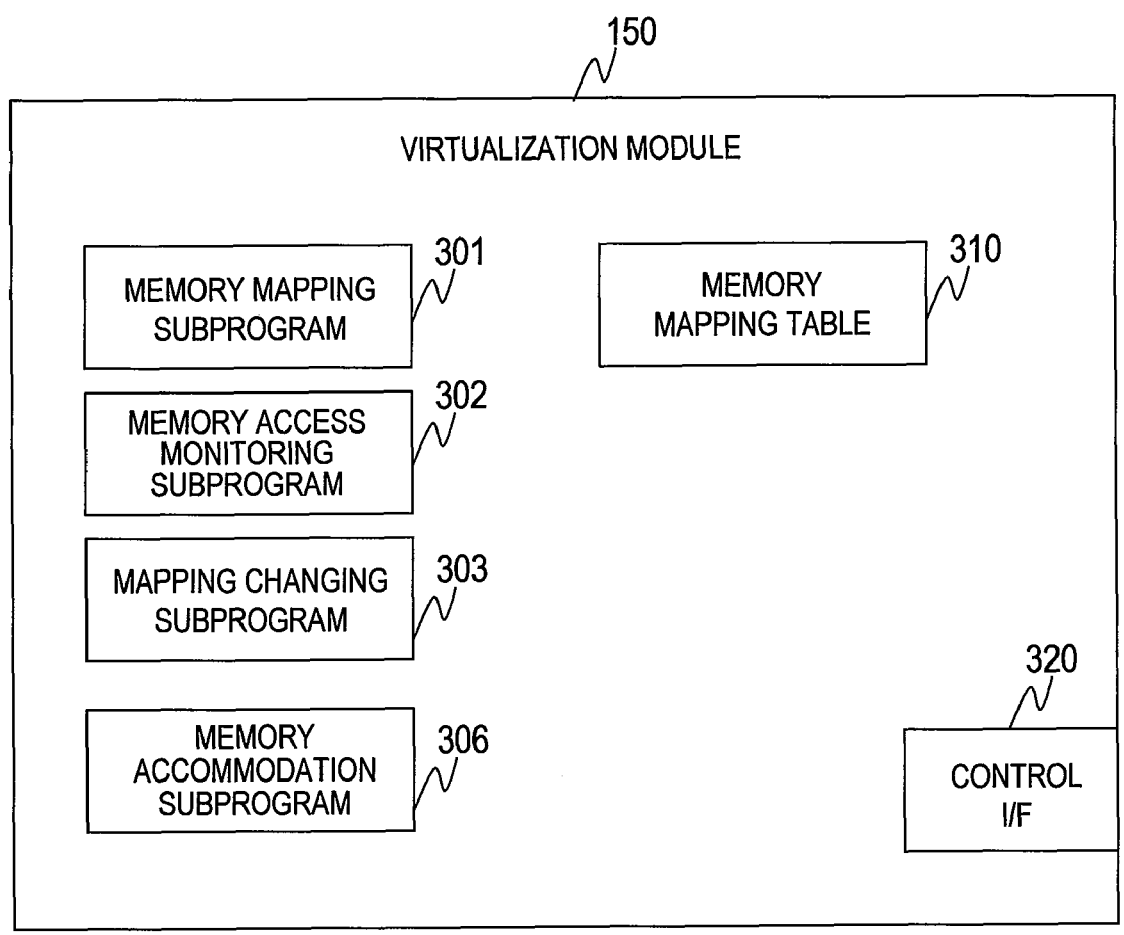
FIG. 31 an explanatory diagram showing a configuration of the virtualization module in accordance with a fourth embodiment of this invention.

FIG. 31 illustrates a configuration of the virtualization module 150 according to the fourth embodiment of this invention. The fourth embodiment is different from the first to third embodiments of this invention in that the virtualization module 150 includes a memory accommodation subprogram 306.

The memory accommodation subprogram 306 accommodates a part of a memory used by a first virtual server 140 to a second virtual server 140 without affecting an OS or an application of the first virtual server 140.

As a method of accommodating a part of the memory, for example, there is a method where the OS of the first virtual server 140 includes a special driver, and the special driver reserves a memory of an OS area, thereby enabling to regard that the OS is using the reserved memory area. Then, the memory area reserved by the special driver can be accommodated to the second virtual server.

The memory accommodation subprogram 306 is called when a memory is accommodated due to a short capacity of the memory chip 401 in Step 1901 of the first embodiment of this invention, which is shown in FIG. 19. The memory accommodation subprogram 306 is called to release memory accommodation when there is an extra capacity of the memory chip 401.

As another method of obtaining the same effect as the effect of memory accommodation, there is a method where the swapping subprogram 305 of the third embodiment of this invention, which is shown in FIG. 28 is used to swap out the memory area of the first virtual server 140 to the auxiliary storage system 133 from the memory to accommodate the memory area to the second virtual server 140.

Fifth Embodiment

A fifth embodiment of this invention is directed to equalization of operation time of memory chips 401 in a normal status for some or all of the memory chips 401. According to the fifth embodiment of this invention, concentration of a frequently used memory chip 401 on a certain memory chip 401 is prevented. Thus, a failure rate can be reduced.

FIG. 32 illustrates a memory management table 611 according to the fifth embodiment of this invention. The fifth embodiment is different from the first to fourth embodiments in that normal operation time 805 is added.

The normal operation time 805 is total operation time of a memory chip 401 indicated by a memory chip 801 in a normal status. For example, when the memory chip 401 operates in a normal status for 300 hours, "300 HOUR" is stored.

According to the fifth embodiment of this invention, in Step 1901 of the first embodiment, which is shown in FIG. 19, the normal operation time 805 of the memory management table 611, which is shown in FIG. 32 is referred to set a layout based on conditions of equalizing the normal operation time 805 of memory chips 401 as much as possible.

Sixth Embodiment

A sixth embodiment of this invention is directed to changing of memory allocation not only by a unit of a virtual server 140 but also by a unit of an OS or a process of the virtual server 140. According to the sixth embodiment of this invention, memory allocation can be controlled by a particle size smaller than a unit of the virtual server 140.

FIG. 33 illustrates a memory mapping table 310 according to the sixth embodiment of this invention. The sixth embodiment of this invention is different from the first to fifth embodiments of this invention in that a process 505 is added.

The process 505 is an identifier of an OS or a process operated in the virtual server 140 of the allocation destination 503. Information of the process 505 is inputted by a user via the input device 205. Alternatively, the information may be obtained from a process table held in the OS of the virtual server 140. Alternatively, other means may be used to obtain the information of the process 505.

Thus, according to the sixth embodiment of this invention, "VIRTUAL SERVER" of the other embodiments can be treated as "PROCESS". In place of holding the information of the OS or the process in the memory mapping table 310, a power control program 110 may hold identical information.

Seventh Embodiment

A seventh embodiment of this invention is directed to a case where the virtualization module 150 of the first embodiment carries out redundancy by writing a memory area used by a virtual server 140 in a plurality of memory chips 401, and can operate the plurality of memory chips 401 in different power saving statuses. According to the seventh embodiment of this invention, when the memory chips 401 are made redundant, power can be saved for some memory ships 401 because there is no need to operate all the memory chips 401 in a high power consumption status.

Figure 34:
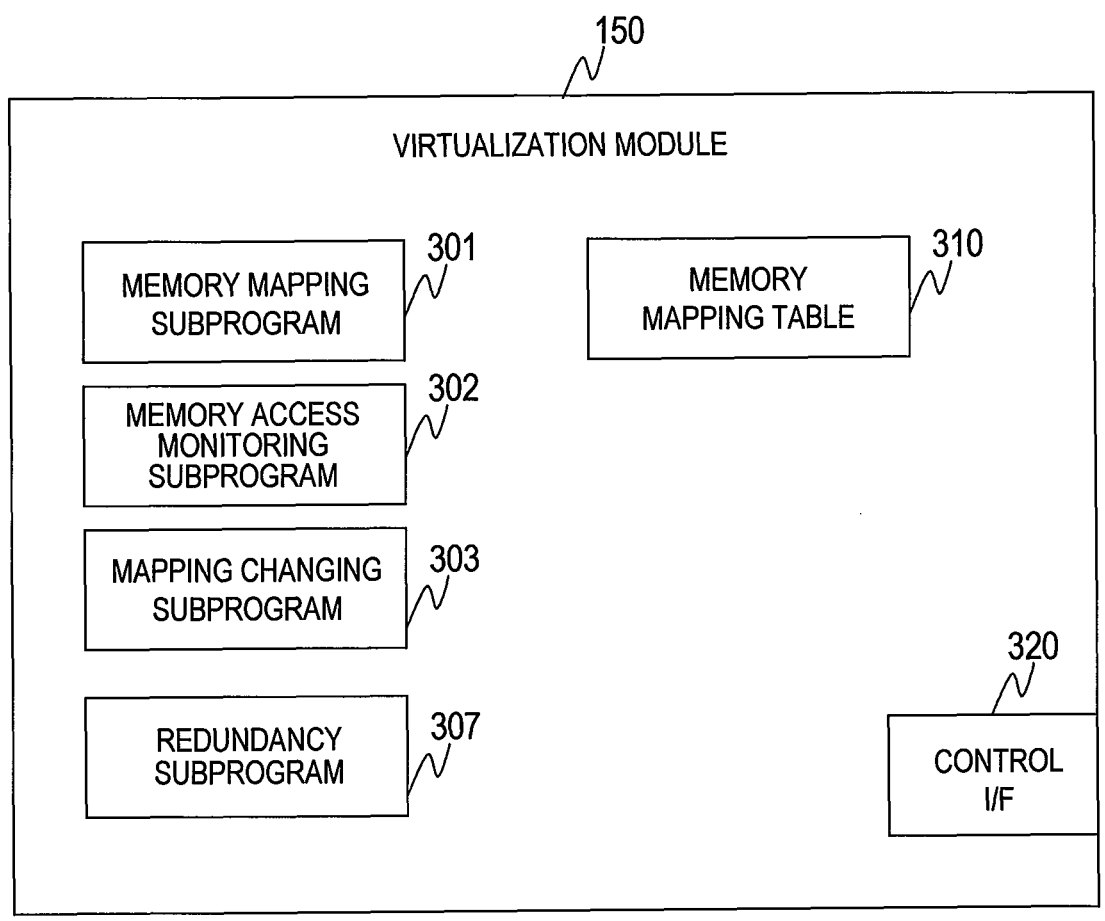
FIG. 34 an explanatory diagram showing a configuration of the virtualization module in accordance with a seventh embodiment of this invention.

FIG. 34 illustrates a configuration of the virtualization module 150 according to the seventh embodiment of this invention. The seventh embodiment is different from the first to sixth embodiments of this invention in that a redundancy subprogram 307 is provided.

The redundancy subprogram 307 writes a memory area used by a virtual server 140 in a plurality of memory chips 401. For writing in a memory of a certain virtual server 140, the redundancy subprogram 307 simultaneously writes memory areas in first and second memory chips 401 to be made redundant. When a delay occurs in writing in one of the memory chips 401, the redundancy subprogram 307 temporarily executes remaining writing in a third memory chip 401. Accordingly, in the first and second memory chips 401, a normal status and a power saving status can be mixed.

Figure 35:
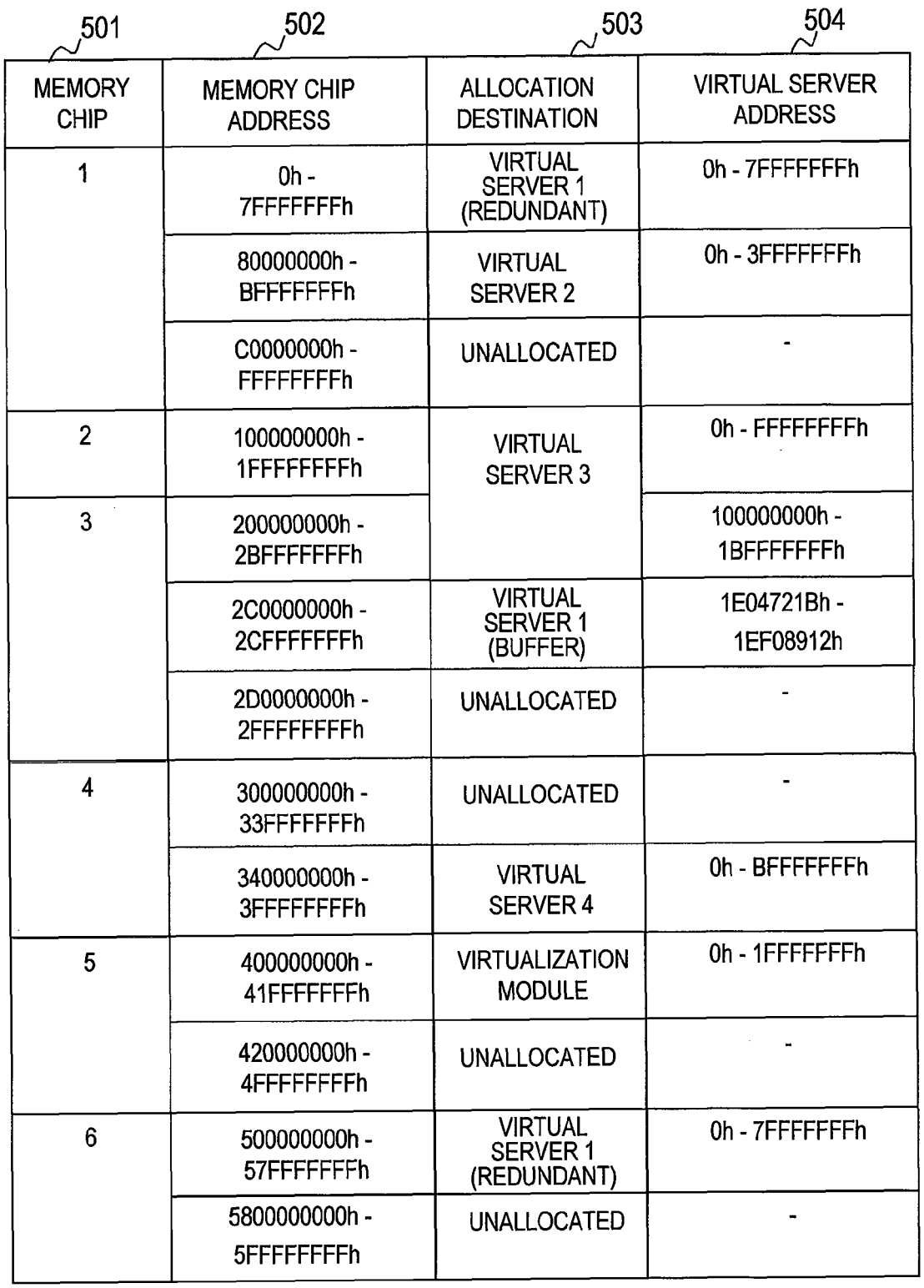
FIG. 35 is an explanatory diagram showing a memory mapping table in accordance with the seventh embodiment of this invention.

FIG. 35 illustrates a memory mapping table 310 according to the seventh embodiment of this invention.

The seventh embodiment is different from the first to sixth embodiments of this invention in that pieces of information indicating a redundant virtual server 140 and a virtual server 140 to serve as a buffer are added to the allocation destination 503.

For example, in a value of each of allocation destinations 503 of 1st and 12th lines of the memory mapping table 310, "VIRTUAL SERVER 1 (REDUNDANT)" indicating a redundant virtual server 140 is stored. In an allocation destination 503 of a 6th line of the memory mapping table 310, "VIRTUAL SERVER 1 (BUFFER)" indicating an area of a third memory chip 401 is stored.

FIG. 36 illustrates a memory management table 611 according to the seventh embodiment of this invention.

The seventh embodiment is different from the first to sixth embodiments of this invention in that the pieces of information indicating the redundant virtual server 140 and the virtual server 140 to serve as a buffer are added to the allocation destination 803.

For example, in each of allocation destinations 803 of 1st and 6th lines of the memory management table 611, "1 (REDUNDANT)" indicating a redundant virtual server 140 is stored. In an allocation destination 803 of a 3rd line of the memory management table 611, "1 (BUFFER)" indicating an area of a third memory chip 401 is stored.

According to the seventh embodiment of this invention, memory statuses 804 are different between the first and second memory chips 401. Thus, power can be saved for one of the memory chips 401. It should be noted that the third memory chip 401 has to operate in a normal state.

Eighth Embodiment

An eighth embodiment of this invention is directed to a case where the power management program 110 monitors power consumption of the server 103 to control the power consumption to be equal to or less than a target value. According to the eighth embodiment of this invention, the power consumption of the server 103 can be guaranteed.

Figure 37:
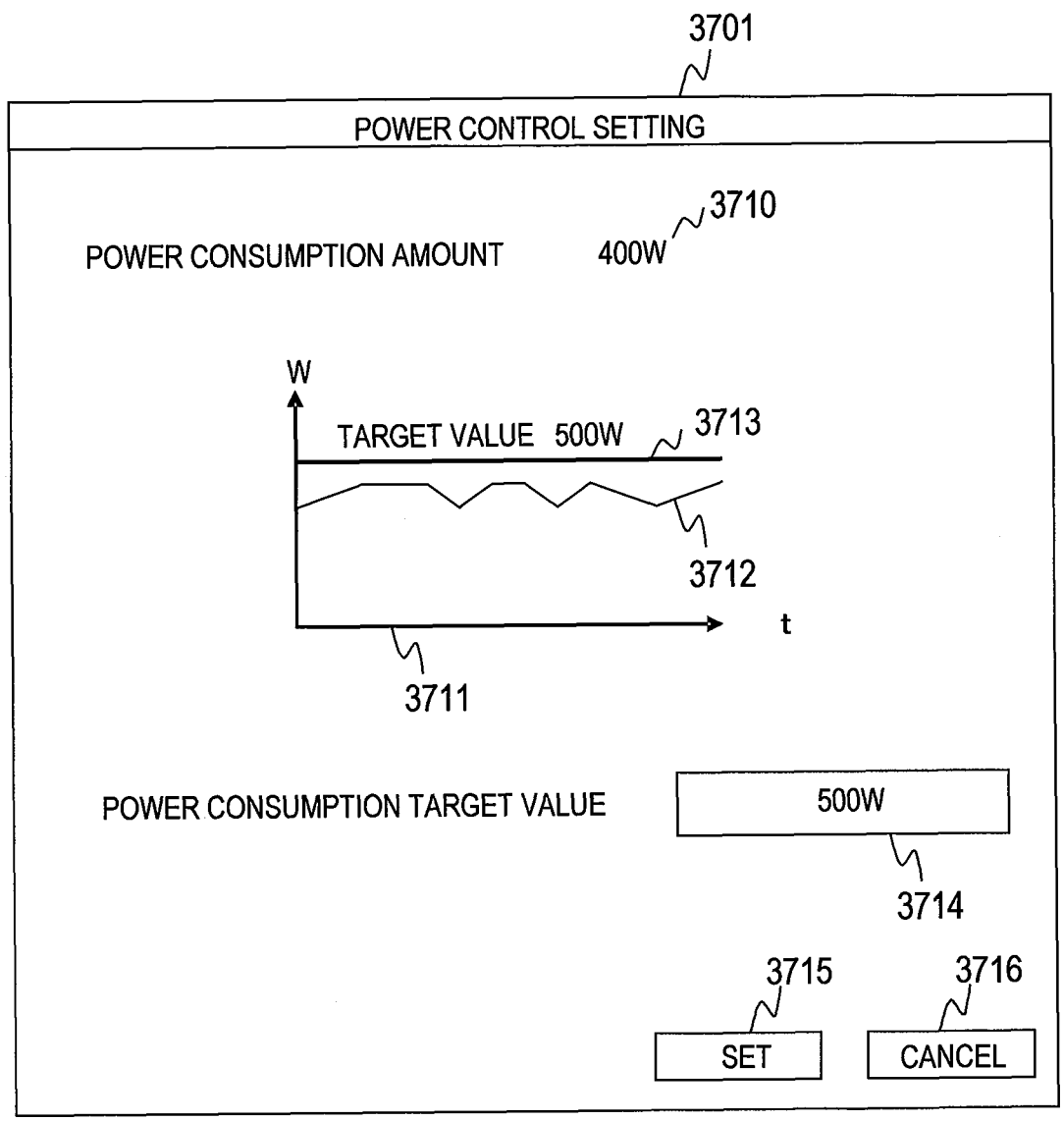
FIG. 37 is an explanatory diagram showing an example of a graphical user interface (GUI) provided by the power management program in accordance with the seventh embodiment of this invention.

FIG. 37 illustrates an example of a GUI provided by the power management program 110 to obtain a target value of power consumption set by a user in the setting subprogram 601 of the first embodiment of this invention, which is shown in FIG. 6.

The GUI shown in FIG. 37 displays a target value of power consumption of the server 103 in the display device 206 of FIG. 2 or another display device via a network by using one of a browser or a dedicated program.

A window 3701 is a window of the browser or the dedicated program. A current power consumption value is displayed in the window 3701 (3710). A history of power consumption values is also displayed as a graph (3711 and 3712).

The user inputs target power in a frame for setting a target power consumption value 3714). The inputted value is reflected in the graph (3713).

Upon completion of the input, a setting button 3715 is operated by a mouse or the like to finish setting. The inputted information is held by the power management program 110.

In order to cancel the setting, a cancel button 1021 is operated by the mouse or the like. In should be noted that the GUI does not always have to allow input of some of such information. The GUI is not limited to the type shown in FIG. 37 as long as the GUI enables input of similar information.

According to the eighth embodiment of this invention, in the process of the memory status control judgment 1804 of the first embodiment of this invention, if power consumption of the server 103 is larger than the target value set by the GUI of FIG. 37, the process proceeds to Step 2006 irrespective of a value of the memory access information 704 in Step 2005 of FIG. 20. A status of the memory 131 is changed to a power saving status so that power consumption of the server 103 can be smaller than the target value set by the GUI of FIG. 37.

While the present invention has been described in detail and pictorially in the accompanying drawings, the present invention is not limited to such detail but covers various obvious modifications and equivalent arrangements, which fall within the purview of the appended claims.

What is claimed is:

1. A method of controlling power consumption of a memory, which is executed in a computer system including at least one operation server, a management server for managing the at least one operation server, and a network for coupling the at least one operation server and the management server,
    wherein the at least one operation server including one or more memory chips which are units to control the power consumption of the memory, a power control module for controlling power consumption of the one or more memory chips between a power saving status and a normal status, and a virtualization module for operating one or more virtual servers,
    wherein the virtualization module including a memory mapping module for managing mapping between the one or more virtual servers and the one or more memory chips,
    wherein the management server managing the mapping information between the one or more virtual servers and the one or more memory chips, and
    wherein the method comprising:
    an information acquisition step of obtaining, by the management server, access information to the one or more memory chips of the one or more virtual servers;
    an instructing step of instructing, by the management server, the at least one operation server to change the power consumption of the one or more memory chips based on whether the obtained access information is capable of achieving predetermined target performance and the mapping information between the one or more virtual servers and the one or more memory chips; and
    a power control step of changing, by the at least one operation server, the power consumption of the one or more memory chips based on the instruction from the management server.

2. The method of controlling power consumption of a memory according to claim 1, wherein the access information includes one of a first value indicating insufficient performance of the memory and a second value indicating sufficient performance of the memory in the case of which a power consumption status of the one or more memory chips is set to the power saving status; and
    wherein the power control step includes the steps of:
    changing the power consumption status of the one or more memory chips to the normal status in the case of which any one of pieces of access information of the one or more virtual servers allocated to the one or more memory chips is the first value, and
    changing the power consumption status of the one or more memory chips to the power saving status in the case of which all the pieces of access information of the one or more virtual servers allocated to the one or more memory chips are the second values.

3. The method of controlling power consumption of a memory according to claim 1, wherein the management server includes a setting interface for setting access information to the one or more memory chips of the one or more virtual servers; and
    wherein the information acquisition step includes the step of using the setting information to obtain a default value of the access information.

4. The method of controlling power consumption of a memory according to claim 1, wherein the virtualization module further includes a memory access monitoring module for monitoring the access information; and
    wherein the information acquisition step includes the step of obtaining the access information from the memory access monitoring module.

5. The method of controlling power consumption of a memory according to claim 4, wherein the virtualization module further includes a mapping changing module for changing mapping between the one or more virtual servers and the one or more memory chips; and
    wherein the method further comprises:
    a judgment step of setting, by the management server, mapping between the one or more virtual servers and the one or more memory chips based on the obtained access information; and
    a changing instruction step of changing, by the management server, the mapping between the one or more virtual servers and the one or more memory chips to the set mapping.

6. The method of controlling power consumption of a memory according to claim 5, wherein the access information contains one of a first value indicating insufficient performance of the memory and a second value indicating sufficient performance of the memory in the case of which the power consumption status of the one or more memory chips is set to the power saving status; and
    wherein the judgment step includes the step of setting the mapping between the one or more virtual servers and the one or more memory chips so as to allocate the one or more virtual servers equal in value of the access information to the same memory chip.

7. The method of controlling power consumption of a memory according to claim 5, wherein the virtualization module further includes a processor monitoring module for monitoring a processor use rate of the one or more virtual servers;
    wherein the information acquisition step includes the step of obtaining the processor use rate of the one or more virtual servers from the processor monitoring modules; and
    wherein the judgment step includes the step of correcting the access information to a value capable of achieving the predetermined target performance in the case of which the obtained processor use rate is equal to or more than a predetermined threshold value.

8. The method of controlling power consumption of a memory according to claim 5, wherein the operation server further includes at least one auxiliary storage system;
    wherein the virtualization module further includes a swapping module for migrating a memory area used by the one or more virtual servers from the one or more memory chips to the at least one auxiliary storage system; and
    wherein the method further comprises the steps of:
    judging, by the management server, whether an insufficient performance status of the memory has continued for a predetermine time based on whether the access information is capable of achieving predetermined allocation performance, and the mapping between the one or more virtual servers and the one or more memory chips; and migrating, by the operation server, according to a result of the judging, some or all of the memory area to the auxiliary storage system by the swapping module.

9. The method of controlling power consumption of a memory according to claim 5, wherein the one or more virtual servers include a first virtual server and a second virtual server;

wherein the virtualization module further includes a memory accommodation module for accommodating a memory area used by the first virtual server to a memory area used by the second virtual server; and wherein the judgment step includes the step of setting the mapping between the one or more virtual servers and the one or more memory chips so as to allocate, when a memory area allocated to the at lest one operation server exceeds a capacity of a memory chip because of allocation of the first virtual server and the second virtual server to the same memory chip, the memory area allocated to the first virtual server to the second virtual server by the memory accommodation module.

10. The method of controlling power consumption of a memory according to claim 5, wherein the management server records operation time of each of the one or more memory chips in the normal status; and wherein the judgment step includes the step of setting, based on the operation time of each of the one or more memory chips in the normal status, the mapping between the one or more virtual servers and the one or more memory chips to equalize operation times of the one or more memory chips in the normal status.

11. The method of controlling power consumption of a memory according to claim 5, further comprising the step of:

obtaining mapping between a process executed by the one or more virtual servers and the one or more memory chips, wherein the management server holds the obtained mapping between the process executed by the one or more virtual servers and the one or more memory chips;

wherein the judgment step includes the step of setting mapping between the process and the one or more memory chips based on the obtained access information; and wherein the changing instruction step includes the step of changing the mapping between the process and the one or more memory chips to the set mapping.

12. The method of controlling power consumption of a memory according to claim 5, wherein the one or more memory chips include a first memory chip and a second memory chip;

wherein the virtualization module further includes a redundancy module for allocating memory areas used by the one or more virtual servers where the same data is written to both of the first memory chip and the second memory chip; and wherein the power control step includes the step of changing a power consumption status of the first memory step to the normal status, and a power consumption status of the second memory chip to the power saving status.

13. The method of controlling power consumption of a memory according to claim 5, further comprising:

a target value acquisition step of obtaining, by the management server, a target power consumption value, wherein the power control step includes the step of changing the power consumption status of the one or more memory chips so as to satisfy the obtained target power consumption value.

14. A computer system comprising:

at least one operation server;

a management server for managing the at least one operation server; and a network for coupling the at least one operation server and the management server, wherein the at least one operation server comprises one or more memory chips which are units to control power consumption of a memory, a power control module for controlling switching of power consumption of the one or more memory chips between a power saving status and a normal status, and a virtualization module for operating one or more virtual servers;

wherein the virtualization module comprises a memory mapping module for managing mapping between the one or more virtual servers and the one or more memory chips;

wherein the management server comprises a setting interface for setting access information to the one or more memory chips of the one or more virtual servers, and wherein the management server is configured to:

manage the mapping between the one or more virtual servers and the one or more memory chips;

obtain, when a power consumption status of the one or more virtual servers is set to the power saving status, access information containing one of a first value indicating insufficient performance of the memory and a second value indicating sufficient performance of the memory via the setting interface;

judge whether all the pieces of access information of the one or more virtual servers allocated to the one or more memory chips are the second values, based on the obtained access information;

instruct the at least one operation server to change the power consumption status of the memory chip to the normal status in case of which any one of pieces of access information of the one or more virtual servers allocated to the one or more memory chips is the first value; and instruct the at least one operation server to change the power consumption status of the memory chip to the power saving status in case of which all the pieces of access information of the one or more virtual servers allocated to the one or more memory chips are the second values, wherein the operation server is configured to change the power consumption of the one or more memory chips based on the instruction from the management server.

15. A medium for recording a program for controlling power consumption of a memory of at least one operation server, wherein the at least one operation server being installed in a computer system which includes the at least one operation server, a management server for managing the at least one operation server, and a network for coupling the at least one operation server and the management server, wherein the management server including an interface coupled to a network, a processor coupled to the interface, and a memory coupled to the processor, wherein the at least one operation server including one or more memory chips which are units to control the power consumption of the memory, a power control module for controlling switching of power consumption of the one or more memory chips between a power saving status and a normal status, and a virtualization module for operating one or more virtual servers, wherein the virtualization module including a memory mapping module for managing mapping between the one or more virtual servers and the one or more memory chips, wherein the memory holding mapping between the one or more virtual servers and the one or more memory chips, and wherein the program controlling the processor of the management server to:

obtain access information containing one of a first value indicating insufficient performance of the memory and a second value indicating sufficient performance of the memory in the case of which a power consumption status of the one or more memory chips is set to the power saving status;

instruct the at least one operation server to change the power consumption status of the one or more memory chips to the normal status in the case of which any one of pieces of access information of the one or more virtual servers allocated to the one or more memory chips is the first value; and instruct the at least one operation server to change the power consumption status of the one or more memory chips to the power saving status in the case of which all the pieces of access information of the one or more virtual servers allocated to the one or more memory chips are the second values.

* * * * *